United States Patent [19]
Mori et al.

[11] Patent Number: 5,594,526
[45] Date of Patent: Jan. 14, 1997

[54] OPTICAL INTEGRATOR AND PROJECTION EXPOSURE APPARATUS USING THE SAME

[75] Inventors: Takashi Mori; Hideki Komatsuda, both of Kawasaki, Japan

[73] Assignee: Nikon Corporation, Japan

[21] Appl. No.: 436,070

[22] Filed: May 5, 1995

[30] Foreign Application Priority Data

May 9, 1994 [JP] Japan .................... 6-094612
Sep. 21, 1994 [JP] Japan .................... 6-226395

[51] Int. Cl.⁶ ............... F21V 29/00; G03B 27/54; G02B 27/09
[52] U.S. Cl. ............... 355/67; 353/32; 359/619; 359/620; 362/268
[58] Field of Search ............... 355/53, 67, 71, 355/77; 359/619, 620, 621, 741; 362/311, 268; 353/32, 38, 44, 122; F21V 29/60; G43B 27/54; G02B 27/09

[56] References Cited

U.S. PATENT DOCUMENTS

| | | |
|---|---|---|
| 2,183,249 | 12/1939 | Schering et al. . |
| 2,186,123 | 1/1940 | Räntsch et al. . |
| 2,326,970 | 8/1943 | Räntsch . |
| 2,803,163 | 8/1957 | Ulffers . |
| 2,991,691 | 7/1961 | Schering . |
| 3,667,832 | 6/1972 | Kitano et al. . |
| 4,497,015 | 1/1985 | Konno et al. ............... 362/268 |
| 4,769,750 | 9/1988 | Matsumoto et al. ............... 362/268 |
| 4,949,630 | 7/1990 | Kikuchi et al. ............... 99/450.7 |
| 4,988,188 | 1/1991 | Ohta ............... 353/122 |
| 5,237,367 | 8/1993 | Kudo ............... 355/67 |
| 5,245,384 | 9/1993 | Mori ............... 355/67 |
| 5,418,583 | 5/1995 | Matsumoto ............... 353/38 |
| 5,471,345 | 11/1995 | Gal et al. ............... 359/619 |

FOREIGN PATENT DOCUMENTS 4-196513   7/1992   Japan .

OTHER PUBLICATIONS

Jere D. Buckley and Charles Karatzas, "Step and scan: A systems overview of a new lithography tool," SPIE vol. 1088 Optical/Laser Microlithography II (1989), pp. 424–433.

*Primary Examiner*—Arthur T. Grimley
*Assistant Examiner*—Herbert Kerner
*Attorney, Agent, or Firm*—Pennie & Edmonds

[57] ABSTRACT

A projection exposure apparatus including a light source system, an optical integrator for forming a plurality of light source images, and a condenser optical system for illuminating a target illumination surface in a rectangular or circular arc pattern in a multiple manner. The optical integrator has, from a light source side, a first lens group which has a plurality of first lens element groups each consisting of a plurality of first lens elements, and a second lens group which has a plurality of second lens element groups each consisting of a plurality of second lens elements. The second lens elements are arranged in a one-to-one correspondence with the first lens elements, and dimensions of the lens section of the first and second lens element satisfy a predetermined relations.

15 Claims, 13 Drawing Sheets

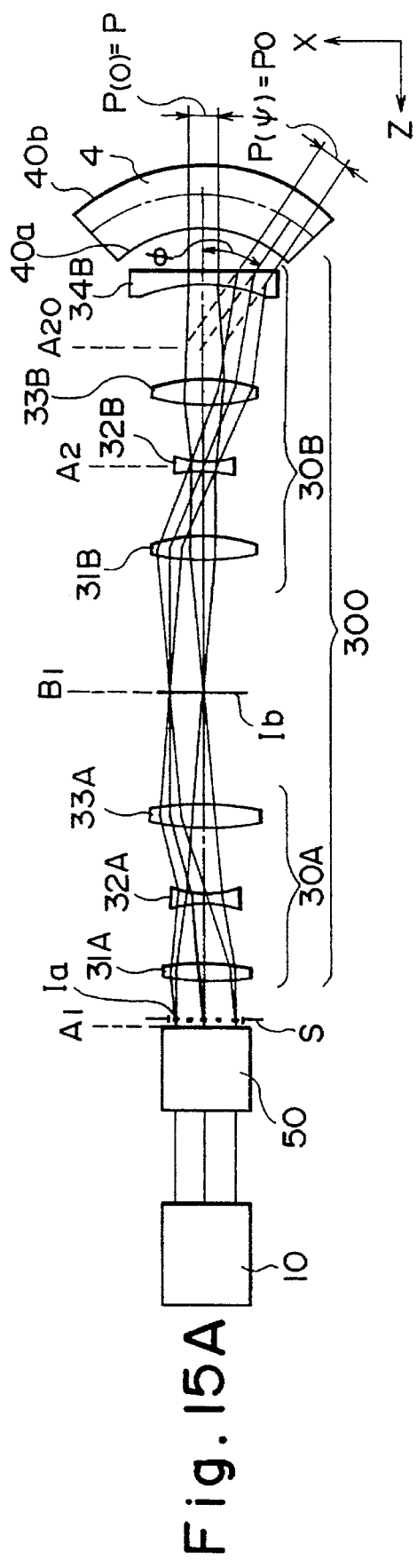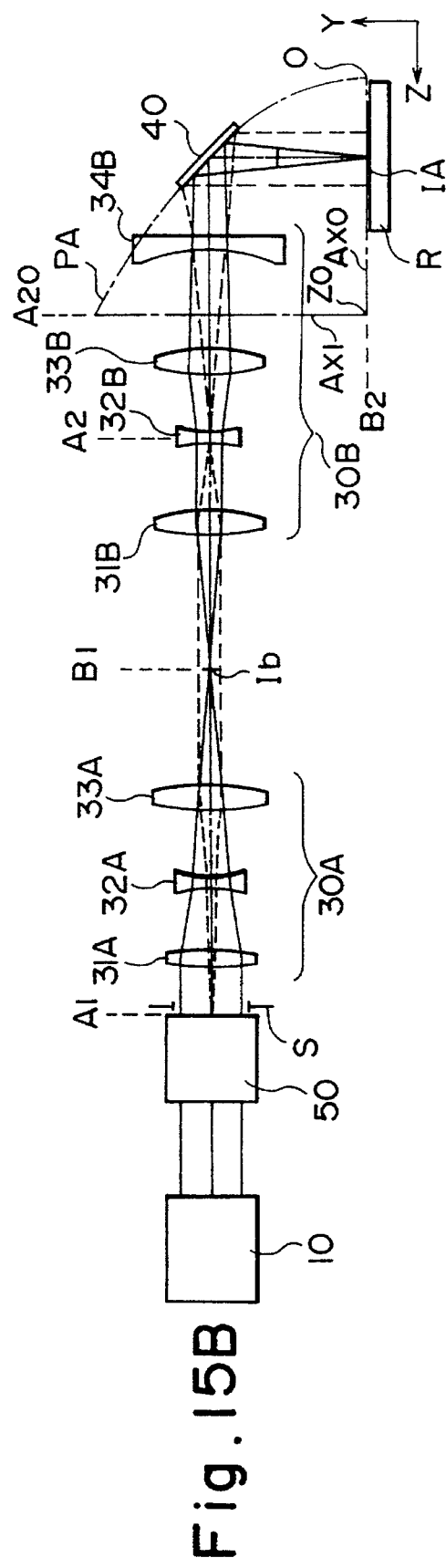

OPTICAL INTEGRATOR AND PROJECTION EXPOSURE APPARATUS USING THE SAME

BACKGROUND OF THE INVENTION

1. Field of the Invention

The present invention relates no a projection exposure apparatus used in a lithography process in the manufacture of semiconductor elements, liquid crystal elements, and the like.

2. Related Background Art

A so-called step-and-repeat-type stepper is known as a conventional projection exposure apparatus. In this apparatus, the entire pattern of an original sheet (reticle) on which a circuit to be projected and exposed is drawn is sequentially projected and exposed onto a photosensitive substrate such as a wafer or a plate coated with a photosensitive agent for every shot through a projection exposure optical system (projection lens). This apparatus is excellent in resolving power and throughput.

In recent years, a scanning-type projection exposure apparatus has been proposed to achieve a higher throughput at a higher resolving power.

A scanning-type projection exposure apparatus is proposed in, e.g., Proc.SPIE 1088(1989) pp 424–433. In this apparatus, a reflecting reduction optical system having a circular arc image field is used to project and expose a pattern on a reticle onto a wafer.

Another scanning-type projection exposure apparatus uses a normal projection optical system (full-field-type projection optical system) having a circular image field to project and expose a pattern on a reticle onto a wafer by a step-and-scan method. For example, Japanese Patent Laid Open No. 4-196513 proposes a method in which a rectangular (slit-like) image field whose long and short sides have different lengths is scanned. This proposed apparatus can ensure a higher resolving power while realizing a higher throughput by a wide exposure field. Therefore, this apparatus has received a great deal of attention as a promising exposure apparatus succeeding the above-described step-and-repeat-type exposure apparatus.

SUMMARY OF THE INVENTION

According to the present invention, there is provided a projection exposure apparatus comprising a light source system for supplying a beam, an optical integrator for forming a plurality of light source images based on the beam from the light source system, and a condenser optical system for condensing a plurality of beams from the optical integrator respectively and illuminating a target illumination surface in a rectangular or circular arc pattern in a multiple manner, wherein the optical integrator has, from a light source side, a first lens group in which a plurality of first lens element groups each consisting of a plurality of first lens elements having a rectangular lens section and aligned along a first direction are arranged along a second direction perpendicular to the first direction, and a second lens group in which a plurality of second lens element groups each consisting of a plurality of second lens elements having a lens section with a predetermined shape (square or rectangular shape) and aligned along the second direction are arranged along the first direction, the second lens elements constituting the second lens group are arranged in a one-to-one correspondence with the first lens elements constituting the first lens group, and the following relations are satisfied:

$lx_1/ly_1 = a, a > 2$ $\Delta lx_1 = a \cdot ly_1/m, m \geq 2$ $lx_2/ly_2 = a/m^2$ $(4a+1)^{0.5}/2 - 0.5 \leq m \leq (4a+1)^{0.5}/2 + 0.5$ where $lx_1$ is a dimension of the lens section of the first lens element along the first direction, $ly_1$ is a dimension of the lens section of the first lens element along the second direction, m is a natural number, $\Delta lx_1$ is a shifting amount along the first direction from the first lens element group arranged at the kth position along the second direction to the first lens element group arranged at the (k+1)th or (k−1)th position adjacent to the first lens element group arranged at the kth position along the second direction, $lx_1$ is a dimension of the lens section of the second lens element along the first direction, and $ly_1$ is a dimension of the lens section of the second lens element along the second direction.

According to the present invention, a square is defined as a shape having adjacent sides with the same length while a rectangle is defined as a shape having adjacent sides with different lengths.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 15A and 15B are views showing scanning-type projection exposure apparatuses for forming the circular arc illumination area IA on the target irradiation surface;

DESCRIPTION OF THE PREFERRED EMBODIMENTS

Figure 1:
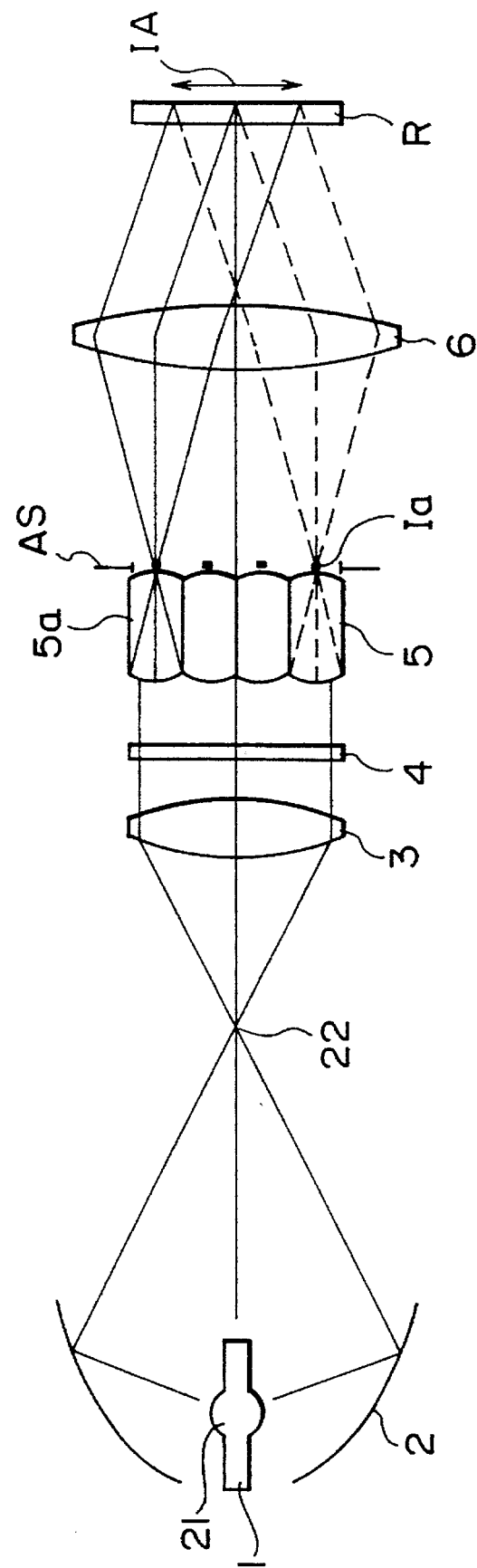
FIG. 1 is a view showing the arrangement of an illumination optical apparatus for a typical step-and-repeat-type exposure apparatus.

FIG. 1 is a view showing an illumination optical apparatus for a typical step-and-repeat-type exposure apparatus. A mercury lamp 1 serving as a light source is arranged at a first focal point 21 of an elliptical mirror 2 serving as a condenser mirror. A light beam from the mercury lamp 1 is condensed at a second focal point 22 of the elliptical mirror 2. The divergent beam from the second focal point 22 is converted into a parallel beam by a collimator lens 3. Thereafter, a light beam having a predetermined exposure wavelength (e.g., the g-line having a wavelength of 436 nm or the i-line having a wavelength of 365 nm) is selected through a bandpass filter 4. The light beam having a predetermined exposure wavelength passes through a fly-eye lens 5 consisting of a group of a plurality of lens elements. A plurality of light source images Ia corresponding to the number of lens elements are formed on the exit side of the fly-eye lens 5, i.e., a plurality of so-called secondary sources are formed. A plurality of light beams from the plurality of light source images (plurality of secondary sources) formed on the exit side of the fly-eye lens 5 are condensed by a condenser lens 6 to illuminate a reticle R as a target illumination object in a multiple manner. A pattern on the reticle R is projected and exposed onto a wafer through a projection optical system (not shown).

Figure 2:
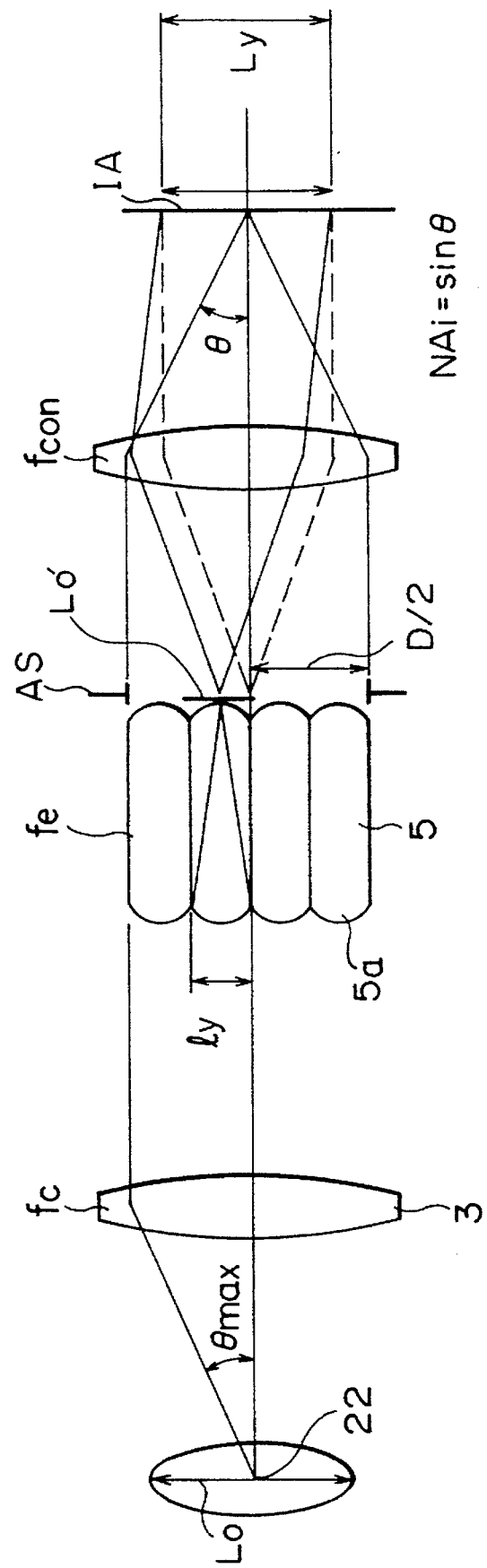
FIG. 2 is a view showing the focusing relationship of the apparatus in FIG. 1.

The fly-eye lens 5 will be described below with reference to FIG. 2 showing the focusing relationship of the illumination optical apparatus in FIG. 1. As shown in FIG. 2, the fly-eye lens 5 consists of a group of lens elements 5a each having incidence- and exit-side lens surfaces in which one of these lens surfaces is located at the focal point of the other. The shape of the lens section on the incidence surface of the lens element 5a is finally enlarged and projected on the reticle R as a target illumination object, thereby determining the shape of the illumination area on the reticle R.

In the step-and-repeat-type exposure apparatus, the shape of the illumination area on the reticle R is almost square. For this reason, the lens element 5a constituting the fly-eye lens in the illumination apparatus has a square section whose long and short sides have the same length.

In this case, the following relations (1) and (2) are satisfied:

$$Lx = (fcon/fe)lx \qquad (1)$$

$$Ly = (fcon/fe)ly \qquad (2)$$

where fe is the focal length of the lens element 5a constituting the fly-eye lens, ly is the dimension of the lens element 5a in the direction along the sheet of drawing (y direction), lx is the dimension of the lens element 5a in a direction perpendicular to the sheet of drawing (x direction), fcon is the focal length of the condenser lens 6, Ly is the dimension of the target irradiation area in the direction along the sheet of drawing (y direction), and Lx is the dimension of the target irradiation area in the direction perpendicular to the sheet of drawing (x direction).

A case in which this illumination optical apparatus is applied to the above-described scanning-type projection exposure apparatus will be considered.

Figure 3A:
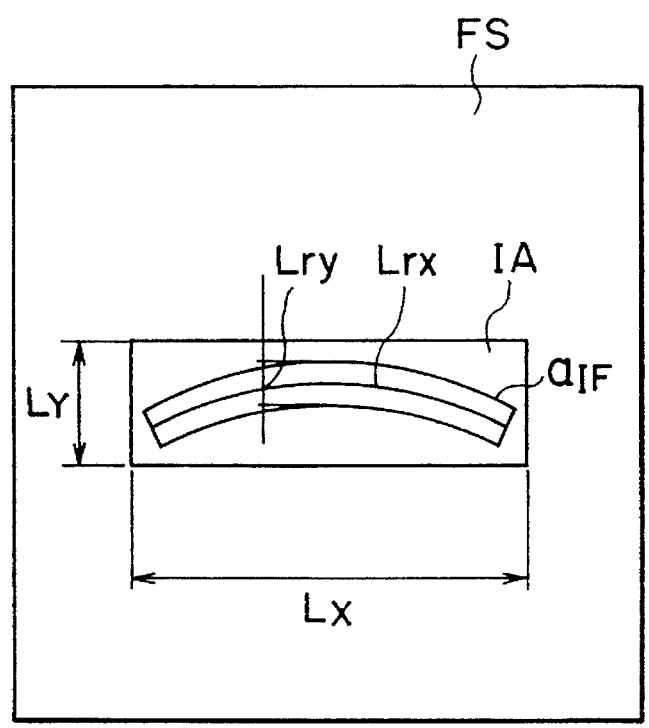
FIGS. 3A and 3B are views showing the structures of field stops to be arranged on a target irradiation surface to form a desired illumination area thereon.

Assume that the image field of the projection optical system for projecting a pattern on the reticle onto a wafer has a circular arc shade. In this case, to accurately form an illumination area corresponding to this circular arc image field, a field stop FS having an aperture $a_{IF}$ with a size corresponding to the circular arc image field can be arranged on the reticle or at a position conjugate with the reticle in the illumination optical apparatus, as shown in FIG. 3A.

In this case, however, a large square illumination area is formed on the reticle by the illumination apparatus in FIG. 2. For this reason, when the field stop FS having the aperture $a_{IF}$ with a size corresponding to the circular arc image field is simply arranged on the reticle, a large optical loss is produced. To ensure a certain light amount, a rectangular illumination area IA (Lx×Ly) capable of covering the circular arc image field on the reticle must be formed when the arc length of the circular arc image field on the reticle is defined as Lrx, and the width of the circular arc image field on the reticle is defined as Lry.

Figure 4:
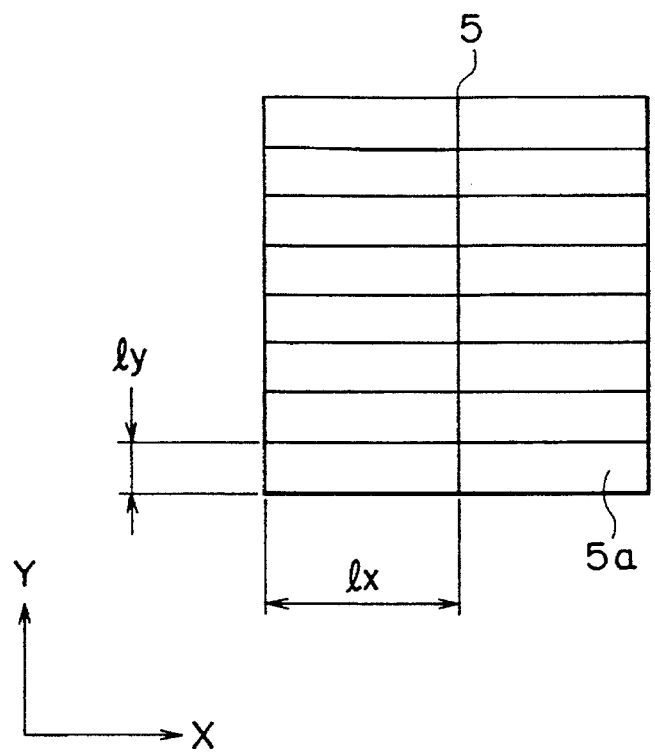
FIG. 4 is a sectional view of a fly-eye lens 5 for forming a rectangular illumination area IA shown in FIGS. 2, 3A, and 3B.

As described above, the shape of the lens section on the incidence surface of the lens element 5a constituting the fly-eye lens 5 determines the shape of the illumination area on the reticle R. For this reason, when the sectional shape of the plurality of lens elements 5a constituting the fly-eye lens 5 is formed to be similar to the rectangular illumination area IA (lx×Ly) shown in FIG. 3A, a relatively high illumination efficiency can be ensured. The sectional shape of the fly-eye lens 5 at this time is shown in FIG. 4.

Figure 3B:
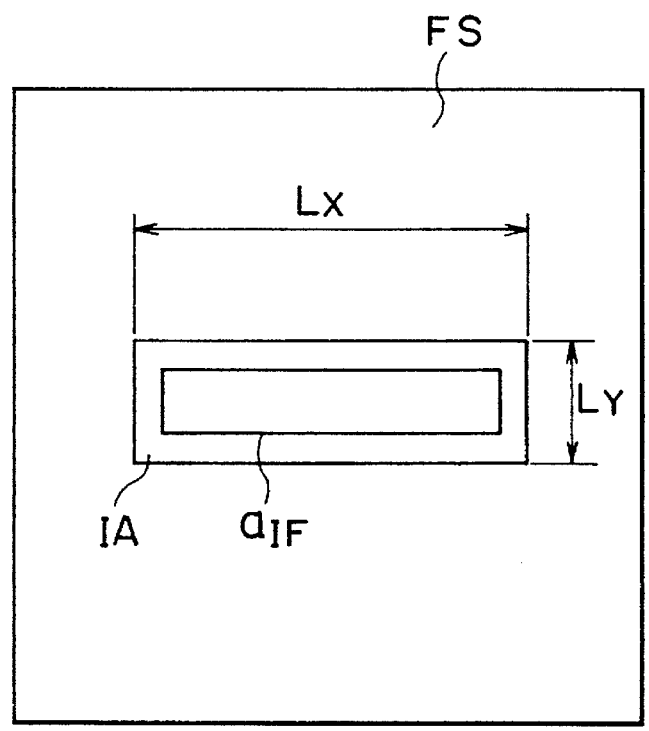

To form an illumination area corresponding to a rectangular image field when the image field of the projection optical system for projecting a pattern on the reticle onto a wafer is rectangular, the field stop FS having the aperture $a_{IF}$ with a size corresponding to the rectangular image field can be arranged on the reticle or at a position conjugate with the reticle in the illumination optical apparatus, as shown in FIG. 3B.

However, in this case as well, a large square illumination area is formed on the reticle by the illumination apparatus in FIG. 2. For this reason, when the field stop FS having the aperture $a_{IF}$ with a size corresponding to the rectangular image field is simply arranged on the reticle, a large optical loss is produced. To ensure a high illumination efficiency, a rectangular illumination area IA (Lx×Ly) almost equal to the rectangular image field on the reticle must be formed.

Therefore, when the sectional shape of the plurality of lens elements 5a constituting the fly-eye lens 5 is formed to be similar to the rectangular illumination area IA (Lx×Ly) shown in FIG. 3B, a relatively high illumination efficiency can be ensured. The sectional shape of the fly-eye lens 5 at this time is shown in FIG. 4.

As described above, when the sectional shape of the plurality of lens elements 5a constituting the fly-eye lens 5 is determined in correspondence with the shape of an illumination area to be formed on the reticle as a target illumination object, a relatively high illumination efficiency can be ensured.

As described above, even when the fly-eye lens 5 in the illumination optical apparatus for a scanning-type projection exposure apparatus is constituted by a group of lens elements each having a longitudinal dimension lx and a widthwise dimension ly, as shown in FIG. 4, to form a rectangular (slit-like) illumination area, this may result in a large degradation in illumination efficiency.

This problem will be described below with reference to FIGS. 2 and 5. As shown in FIG. 2, the diameter of the image of the mercury lamp, which is formed at the second focal point 22 by the elliptical mirror 2, is represented by L0, and the focal length of the collimator lens 3 is represented by fc. As described above, the lens element 5a constituting the fly-eye lens 5 has incidence- and exit-side lens surfaces in which one of these lens surfaces is located at the focal point of the other. For this reason, a light source image having a diameter L0' is formed on the exit surface of each lens element 5a in the fly-eye lens 5. At this time, the image of the mercury lamp and the light source image L0' formed on the exit surface of each lens element 5a in the fly-eye lens 5 satisfy the following relation:

$$L0'=(fe/fc)l0 \qquad (3)$$

Assume that the shorter side dimension ly of the section of each lens element constituting the fly-eye lens 5 and the diameter of the light source image formed on the exit side of each lens element constituting the fly-eye lens 5 satisfy the following relation:

$$ly<L0' \qquad (4)$$

Figure 5:
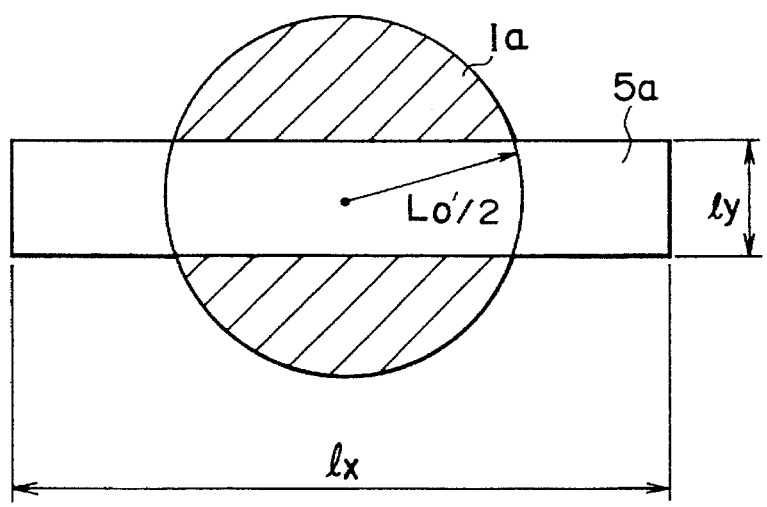
FIG. 5 is a view showing a degradation in illumination efficiency caused by using the fly-eye lens 5 in FIG, 4.

In this case, as shown in FIG. 5, a light beam corresponding to the hatched portion is irradiated on the side surfaces (inner surfaces) of each lens element 5a of the fly-eye lens 5. Therefore, the light beam corresponding to the hatched portion is not used as illumination light at all, resulting in a large degradation in illumination efficiency.

In an illumination optical apparatus for a projection exposure apparatus, a numerical aperture NAi (to be referred to as an illumination numerical aperture NAi hereinafter) of the illumination optical apparatus is given as an important specification in addition to the shape of an illumination area on a reticle (or a substrate including a wafer). The ratio of the illumination numerical aperture NAi to the numerical aperture of the projection optical system is generally called a σ value, i.e., a so-called coherence factor, which determines the spatial coherence on a substrate including a wafer, thereby largely influencing the resolving power and fidelity of the projection optical system. In the illumination optical system with the above arrangement, the illumination numerical aperture NAi is determined by an aperture diameter D of an aperture stop AS which is arranged at the position of a plane light source (secondary source) consisting of a group of a lot of light source images formed on the exit surface of the fly-eye lens 5. In this case, the following relation is satisfied:

$$NAi=D/(2fcon) \qquad (5)$$

where fcon is the focal length of the condenser lens 6.

The diameter of a parallel beam (collimated beam) converted by the collimator lens 3 is preferably set to almost coincide with the aperture diameter D of the aperture stop AS, thereby effectively using the entire beam. Therefore, the following relation is satisfied:

$$fc=D/(2\sin\theta max) \qquad (6)$$

where θmax is the maximum divergent angle of the light source image formed at the second focal point 22 of the elliptical mirror.

As shown in FIG. 4, when the fly-eye lens 5 in the illumination optical apparatus for a projection exposure apparatus is constituted by a group of lens elements 5a each having a longitudinal dimension lx and a widthwise dimension ly, the above-described relation (2) is satisfied between the widthwise dimension Ly of the rectangular illumination area formed on the reticle as a target illumination object and the widthwise dimension ly of the lens element constituting the fly-eye lens 5.

Therefore, the above-described equations (2), (3), (5), and (6) yield the following relation:

$$ly/L0'=(Ly\cdot NAi)/(L0\cdot\sin\theta max) \qquad (7)$$

From this equation (7), it can be understood that if the widthwise dimension Ly of the rectangular illumination area formed on the reticle as a target illumination object and the illumination numerical aperture NAi are given as the specifications of the illumination optical system, the illumination efficiency is determined not by the intervening optical system but only by a product of the diameter L0 of the image of the mercury lamp, which is formed by the elliptical mirror, and the maximum divergent angle θmax of the light beam emanating from the image of the mercury lamp, i.e., L0×sinθmax.

To maintain a high illumination efficiency, the following relation is preferably satisfied in accordance with the above inequality (4):

$$ly/L0'\geq 1 \qquad (8)$$

To satisfy this relation (8), the arc formed by the mercury lamp can be reduced to reduce the diameter L0' of the light source image formed on the exit side of each lens element of the fly-eye lens 5, i.e., reduce the value L0 x sinθmax. In this case, when the interval between opposing electrodes in the mercury lamp is reduced, the arc itself can be reduced. However, when the interval between the electrodes is reduced while maintaining the beam width of an exposure wavelength capable of correcting the chromatic aberration of the projection optical system, the current amount largely increases with respect to the same input power. For this reason, it becomes difficult to design a light source for an exposure apparatus of this type while ensuring sufficient reliability and stability. In addition, the light emission efficiency with respect to the input power is also degraded.

In the fly-eye lens serving as an optical integrator in the illumination optical apparatus, the incidence side of each lens element is conjugate with the target irradiation surface. The shape of each lens element is geometrically similar to the slit-like rectangular target irradiation surface which is given as a specification. The lens element in the fly-eye lens is constituted by a thick lens having incidence and exit-side lens surfaces in which one of these lens surfaces is at the focal point of the other. For this reason, when these thick lenses are joined to form a fly-eye lens, the sectional shape of the exit-side lens surface inevitably becomes equal to that of the incidence-side lens surface, resulting in the above-described degradation in illumination efficiency.

In principle, the sectional shape of the exit-side lens surface of each lens element in the fly-eye lens has nothing to do with the shape of the target irradiation surface. An optimal shape must be determined by the shape of the light source. Therefore, a fly-eye lens satisfying the following conditions must be formed:

(I) The sectional shape of each lens element on the incidence side of the fly-lens is similar to the target irradiation surface.

(II) The sectional shape of each lens element on the exit side of the fly-eye lens can pass a circular light beam or a circular light source image therethrough.

(III) Each lens element on the incident side and a corresponding lens element on the exit side of the fly-eye lens have a shape which allows a two-dimensional arrangement without any gaps (e.g., a triangular, square, or hexagonal shape).

(IV) Each lens element on the incident side and a corresponding lens element on the exit side of the fly-eye lens are coaxially arranged in a one-to-one correspondence.

According to the present invention, to satisfy the above conditions (I) to (IV), the fly-eye lens serving as an optical integrator constituted by a group of a plurality of lens elements is divided into two groups, i.e., a first lens group on the incidence side and a second lens group on the exit side. The sectional shape of each lens element in the first lens group is formed to have a shape similar to the rectangular illumination area to be formed. At the same time, the sectional shape of each lens element in the second lens group on the exit side is formed to have a shape capable of passing a circular light beam having a certain size or a circular light source image having a certain size therethrough, thereby optimizing the arrangement of the lens elements in each lens group. With this arrangement, according to the present invention, a slit-like rectangular illumination area or a circular arc illumination area which is required in the illumination optical apparatus for a scanning-type projection exposure apparatus can be formed while realizing a high illumination efficiency by satisfying the above relation (8).

Figure 6:
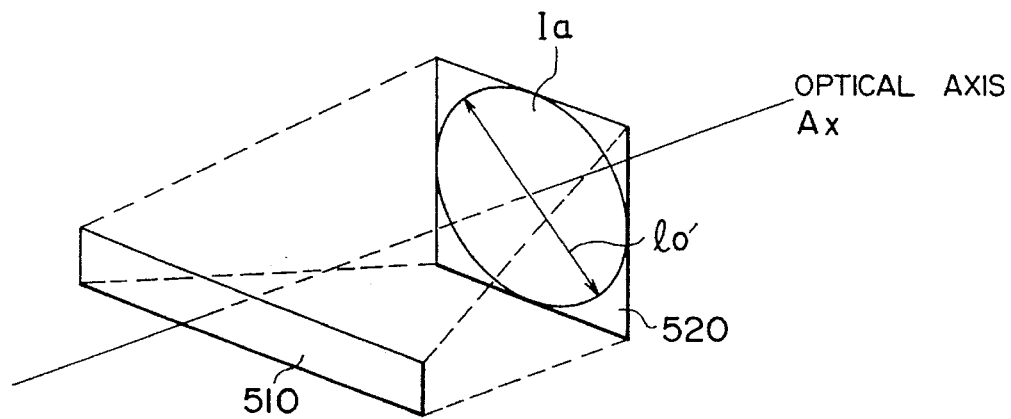
FIG. 6 is a perspective view for explaining the principle of a fly-eye lens 50 according to the present invention.

The principle of the present invention will be described below with reference to FIGS. 6 and 7. According to the fly-eye lens of the present invention, as shown in FIG. 6, the optical axis of a first lens element 510 in the first lens group coincides with that of a corresponding second lens element 520 in the second lens group opposing the first lens group. The shape of the lens section of the first lens element 510 in the first lens group on the incidence side is formed to have a shape similar to that of the illumination area. The shape of the lens section of the second lens element 520 in the second lens group on the exit side is formed to have a shape capable of passing a circular light beam or a circular light source image Ia therethrough. With this structure, the lens sections of the lens elements in the individual lens groups have different shapes.

Figure 7:
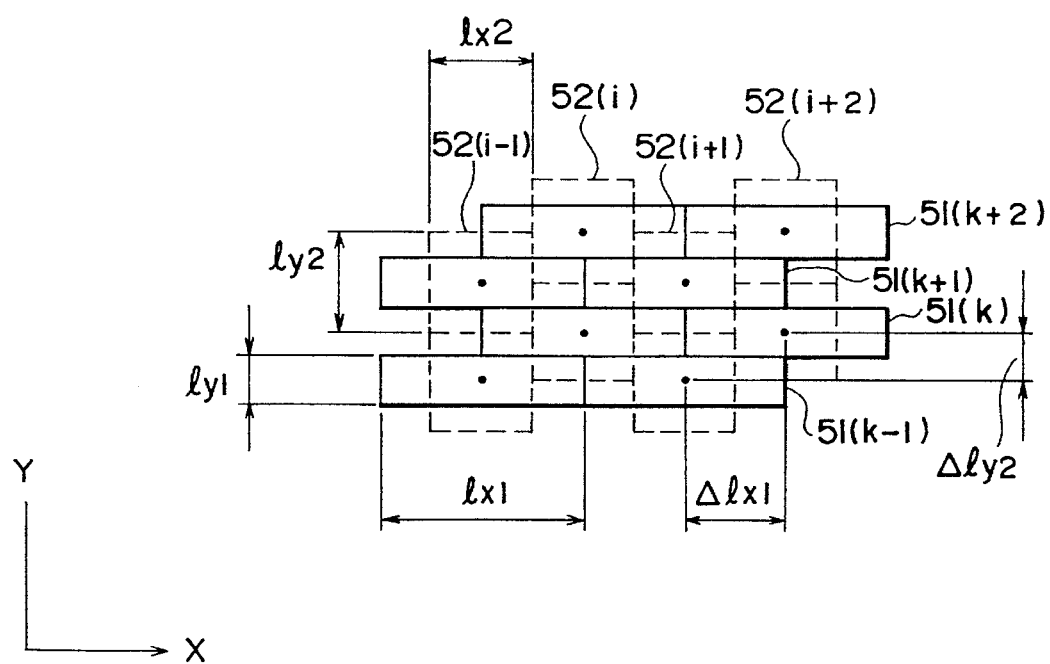
FIG. 7 is a view for explaining the method of arranging the fly-eye lens 50 according to the present invention.

FIG. 7 is a view showing an arrangement in which the first lens elements 510 in the first lens group and the second lens elements 520 in the second lens group are arranged without any gaps.

FIG. 7 shows the fly-eye lens serving as an optical integrator according to the present invention, which is viewed from the light source side. Referring to FIG. 7, the first lens elements 510 constituting the first lens group on the incidence side are indicated by solid lines while the second lens elements 520 constituting the second lens group on the exit side are indicated by dotted lines.

As shown in FIG. 7, the sectional shape of the first lens element 510 in the first lens group on the incidence side, which is determined in accordance with the specifications of the illumination optical apparatus, is a slit-like rectangle whose sides that are perpendicular to each other have different lengths. In the first lens group, a plurality of first lens element groups ($51(k-1)$ to $51(k+2)$) each having a plurality of first lens elements 510 arranged along the X direction (first direction) are arranged along the Y direction (second direction). The plurality of first lens element groups ($51(k-1)$ to $51(k+2)$) arranged along the Y direction are alternately shifted from each other by a predetermined amount along the X direction, where k is a natural number of 2 or more.

In this case, the following relations are satisfied:

$$lx_1/ly_x = a, a > 1 \tag{9}$$

$$\Delta lx_1 = lx_1/m = ly_1 \times (a/m) \tag{10}$$

where $lx_1$ is the longitudinal dimension of the section of the first lens element 510, $ly_1$ is the widthwise dimension of the section of the first lens element 510, m is a natural number, and $\Delta lx_1$ is the shifting amount along the X direction from the first lens element group $51(k)$ arranged at the kth position along the Y direction to the first lens element group ($51(k-1)$ or $51(k+1)$) arranged at the (k−1)th or (k+1)th position adjacent to the first lens element group $51(k)$ along the Y direction.

The sectional shape of the second lens element 520 in the second lens group on the exit side is a rectangle (a square or a rectangle). In the second lens group, a plurality of second lens element groups ($52(i-1)$ to $52(i+2)$) each having a plurality of second lens elements 520 arranged along the Y direction are arranged along the X direction. The plurality of second lens element groups ($52(i-1)$ to $52(i+2)$) arranged along the X direction are alternately shifted from each other by a predetermined amount along the Y direction, where i is a natural number of 2 or more.

At this time, the second lens elements 520 constituting the second lens group and the first lens elements 510 constituting the first lens group are arranged in a one-to-one correspondence.

The relation between the second lens elements 520 constituting the second lens group and the first lens elements 510 constituting the first lens group will be described. As shown in FIG. 7, the shifting amount $\Delta lx_1$ in the X direction between the optical axes of each two first lens elements 510 adjacent along the Y direction is 1/m the pitch when the dimension $lx_1$ ($= ly_1 \times a$) of the first lens element 510 along the X direction is defined as one pitch.

Assume that the dimension of the section of each second lens element 520 constituting the second lens group along the X direction is represented by $lx_2$, and the dimension along the Y direction is represented by $ly_2$. In this case, as is apparent from FIG. 7, the sectional shape of the second lens element 520 corresponds to a shape obtained when the first lens element 510 is divided by m along the X direction and m resultant pieces are arrayed along the Y direction.

Therefore, the following relations are satisfied between the first lens element 510 in the first lens group and the second lens element 520 in the second lens group:

$$lx_2 = \Delta lx_1 = ly_1 \times (a/m) \tag{11}$$

$$ly_2 = ly_1 \times m \tag{12}$$

where $lx_1$ is the dimension of the section of the second lens element 520 constituting the second lens group along the X direction, and $ly_2$ is the dimension thereof along the Y direction.

The above equations (11) and (12) yield the following relation:

$$lx_2/ly_2 = a/m^2 \qquad (13)$$

In accordance with the equation (13), when $a/m^2=1$, i.e., $a=m^2$ ($a=1, 4, 9, 16, 25, \ldots$) or $m=(a)^{0.5}$ (m is a natural number), the second lens element 520 in the second lens group has a square section ($lx_2=ly_2$) whose sides that are perpendicular to each other have the same length. In this case, the second lens element 520 can most efficiently pass a circular light beam or a circular light source image therethrough.

When the value $a$ is a real number other than the above-described values ($a>1$), the lens section of the second lens element 520 slightly deviates from a square. An optimal range of the value $a$, which can realize the object of the present invention, will be described below in detail.

To obtain a second lens element 520 having a square section ($lx_2=ly_2$), when $a=9$, $m=3$, and when $a=16$, $m=4$ in accordance with the above equation (13).

If the value $a$ satisfies $9<a<16$, the value m can be 3 or 4. The value m will be considered.

Assume that the value $a$ satisfies $9<a<16$. When the value $a$ is close to 9, and $m=3$, the second lens element 520 in the second lens group has a section very close to a square. However, when the value $a$ is close to 16, and $m=3$, the second lens element 520 in the second lens group has a rectangular section rather than a square section. When $a=10$, and $m=3$, an aspect ratio of 10:9 is obtained in accordance with the above equation (13), i.e., $lx_2/ly_2=10/9$. At this time, the second lens element 520 in the second lens group has a section very close to a square. However, when $a=15$, and $m=3$, an aspect ratio of 15:9 is obtained in accordance with the above equation (13), i.e., $lx_2/ly_2=15/9$. Therefore, the section of the second lens element 520 in the second lens group cannot have a square shape.

On the other hand, when the value $a$ is close to 16 and $m=4$, the second lens element 520 in the second lens group has a section very close to a square. However, when the value $a$ is close to 9, and $m=4$, the second lens element 520 in the second lens group has a rectangular section rather than a square section. When $a=15$, and $m=4$, an aspect ratio of 15:16 is obtained in accordance with the above equation (13), i.e., $lx_2/ly_2=15/16$. At this time, the second lens element 520 in the second lens group has a section very close to a square. However, when $a=10$, and $m=4$, an aspect ratio of 5:8 is obtained in accordance with the above equation (13), i.e., $lx_2/ly_2=10/16$. Therefore, the section of the second lens element in the second lens group cannot have a square shape.

Therefore, the value $a$ as a threshold for setting the value m to 3 or 4 is obtained when the sectional shape of the second lens element 520 upon setting $m=3$ is similar to that upon setting $m=4$, i.e., when the aspect ratio of the section of the second lens element 520 upon setting $m=3$ is the reciprocal number of the aspect ratio of the section of the second lens element 520 upon setting $m=4$.

Assume that the value $a$ satisfies $9<a<16$. When $a=12$, and $m=3$, an aspect ratio of 4:3 is obtained in accordance with the equation (13), i.e., $lx_2/ly_2=12/9$. When $a=12$, and $m=4$, an aspect ratio of 3:4 is obtained in accordance with the equation (13), i.e., $lx_2/ly_1=12/16$. For this reason, the threshold (to be referred to as a threshold value hereinafter) of the value $a$ for determining the value m is 12. Therefore, when $9<a<12$, $m=3$. When $12<a<16$ $m=4$. In this case, the second lens element 520 can have a section close to a square.

A general relation in the above case will be considered. Assuming that the natural number $m=1, 2, 3, \ldots, M-1, M, M+1, \ldots$, the threshold value $a$ between the values $(M-1)$ and M and the threshold value $a$ between the values M and $(M+1)$ will be obtained.

The threshold value $a$ between the values $(M-1)$ and M corresponds to a value obtained when the aspect ratio of the section of the second lens element 520 upon setting $m=M-1$ is the reciprocal number of that upon setting $m=M$. Therefore, the following relation is obtained from the equation (13):

$$a/(M-1)^2 = M^2/a \qquad (14)$$

The equation (14) finally yields the following relation:

$$a=(M-1)M \qquad (15)$$

The threshold value $a$ between the values M and $(M+1)$ corresponds to a value obtained when the aspect ratio of the section of the second lens element 520 upon setting $m=M$ is the reciprocal number of that upon setting $m=M+1$. For this reason, the following relation is obtained from the equation (13):

$$a/M^2 = (M+1)^2/a \qquad (16)$$

The equation (16) finally yields the following relation:

$$a=M(M+1) \qquad (17)$$

When the natural number M is used as a reference value, the value $a$ must satisfy the following relation in accordance with the above equations (15) and (17):

$$(M-1)M \leq a \leq M(M+1) \qquad (18)$$

Therefore, the natural number M must satisfy the following relation in accordance with the above relation (18):

$$(4a+1)^{0.5}/2 - 0.5 \leq M \leq (4a+1)^{0.5}/a + 0.5 \qquad (19)$$

When the natural number M is replaced with the natural number m, the above relation (19) can be finally rewritten as:

$$(4a+1)^{0.5}/2 - 0.5 \leq m \leq (4a+1)^{0.5}/2 + 0.5 \qquad (20)$$

The above relation (20) can be regarded as a general formula when the value $a$ is an arbitrary real number because the relation (20) includes the value a ($a=1, 4, 9, 16, 25, \ldots$) for obtaining a second lens element 520 having a square section.

With the above relation (20), the sectional shape of the first lens element 510 in the first lens group becomes similar to that of the second lens element 520 in the second lens group, and the problem of the illumination efficiency cannot be solved in some cases. For this reason, a more optimal range will be considered.

As is apparent from the above equations (9) and (13), when $m=1$, the sectional shape of the first lens element 510 in the first lens group becomes similar to that of the second lens element 520 in the second lens group, so the object of the present invention cannot be achieved. Therefore, to prevent the section of the first lens element 510 from becoming similar to that of the second lens element 520, the following relation must be satisfied:

$$m \geq 2 \qquad (21)$$

The range of the value $a$ for avoiding $m=1$ will be considered. Substitution of $m=1$ in the above relation (20) yields the following relations:

$$(4a+1)^{0.5}/2-0.5 \leq 1 \quad (22)$$

$$1 \leq (4a+1)^{0.5}/2+0.5 \quad (23)$$

The value $a$ satisfies the following relations in accordance with the above relations (22) and (23):

$$a \leq 2 \quad (24)$$

$$a \geq 0 \quad (25)$$

The value $a$ is a real number of 1 or more. Therefore, the range of the value $a$ for avoiding m=1 is represented as follows in accordance with the relation (24):

$$a > 2 \quad (26)$$

To achieve the object of the present invention, the first and second lens groups must satisfy the following conditions in accordance with the above relations (9), (10), (13), (20), (21), and (26):

$$lx_1/ly_1 = a, \ a > 2 \quad (27)$$

$$\Delta lx_1 = lx_1/m = ly_1 x(a/m), \ m \geq 2 \quad (28)$$

$$lx_2/ly_2 = a/m^2 \quad (29)$$

$$(4a+1)^{0.5}/2-0.5 \leq m \leq (4a+1)^{0.5}/2+0.5 \quad (30)$$

When these conditions (27) to (30) are simultaneously satisfied, the aspect ratio of the second lens element constituting the second lens group satisfies $1/2 < lx_2/ly_2 \leq 3/2$. Although slightly different from an ideal state in which the highest illumination efficiency is obtained when $lx_2/ly_2 = 1$ (when the section is square), a much higher illumination efficiency than that of the prior art can be achieved within a range of $1/2 < lx_2/ly_2 \leq 3/2$, thereby substantially sufficiently realizing the object of the present invention. In addition, to realize a further sufficiently higher illumination efficiency, the second lens element constituting the second lens group preferably has a rectangular (rectangular or square) section having an aspect ratio satisfying $2/3 \leq lx_2/ly_2 \leq 3/2$.

When the above equations (9), (10), and (13) are satisfied, the following relation is inevitably satisfied, as is apparent from FIG. 7:

$$\Delta ly_2 = ly_2/m \quad (31)$$

where $\Delta ly_2$ is the shifting amount along the Y direction (second direction) from the second lens element group 52(i) arranged at the ith position along the X direction (first direction) to the second lens element group (52(i-1) or 52(i+1)) arranged at the (i-1)th or (i+1)th position adjacent to the second lens element group 52(i).

Figure 8:
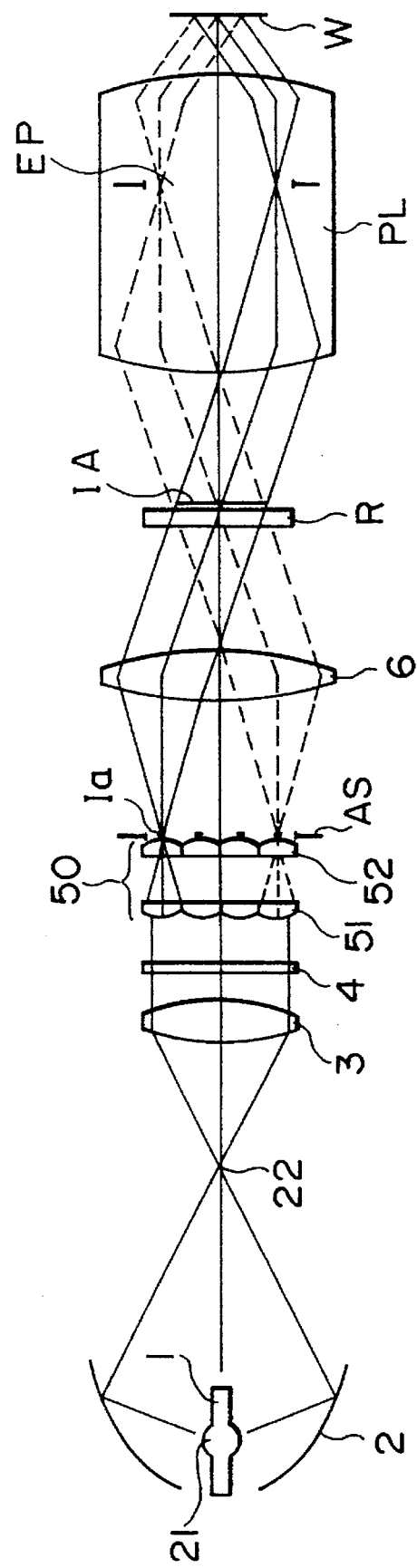
FIG. 8 is a view schematically showing the arrangement of an embodiment in which the present invention is applied to a scanning-type projection exposure apparatus having a rectangular exposure field.

FIG. 8 is a view schematically showing the overall arrangement of the illumination apparatus when the illumination optical apparatus of the present invention is applied to a scanning-type projection exposure apparatus. The same reference numerals as in FIG. 1 denote the same members in FIG. 8.

As shown in FIG. 8, the mercury lamp 1 serving as a light source is arranged at the first focal point 21 of the elliptical mirror 2 serving as a condenser mirror. A light beam from the mercury lamp 1 is condensed at the second focal point 22 of the elliptical mirror 2. The divergent beam from the second focal point 22 is converted into a parallel beam by the collimator lens 3 serving as a collimate optical system arranged to have a front-side focal point coinciding with the second focal point 22. Thereafter, a light beam having a predetermined exposure wavelength (e.g., the g-line having a wavelength of 436 nm or the i-line having a wavelength of 365 nm) is selected through the bandpass filter 4. The beam having a predetermined exposure wavelength is incident on a fly-eye lens 50 serving as an optical integrator. This fly-eye lens 50 is sequentially constituted from the light source side by a first lens group 51 on the light source side, which consists of a group of first lens elements 510, and a second lens group 52 on the exit side, which consists of a group of second lens elements 520 arranged to correspond to the first lens elements 510 in a one-to-one correspondence.

The first lens element 510 is constituted by a plano-convex lens having a convex surface facing the light source side and the same refracting power in orthogonal directions. The first lens element 510 has a rectangular (slit-like) lens section similar to the illumination area IA (to be described later).

The second lens element 520 is constituted by a plano-convex lens having a convex surface facing the exit side (illumination surface side) and the same refracting power in orthogonal directions. The second lens element 520 has a square lens section to efficiently pass a circular light beam or a circular light source image therethrough.

The optical axis of each of the first lens elements 510 opposing the second lens elements 520 in a one-to-one correspondence coincides with the axis the corresponding second lens element 520. The optical axis of each lens element is parallel to an optical axis Ax of the collimator lens 3.

Figure 9:
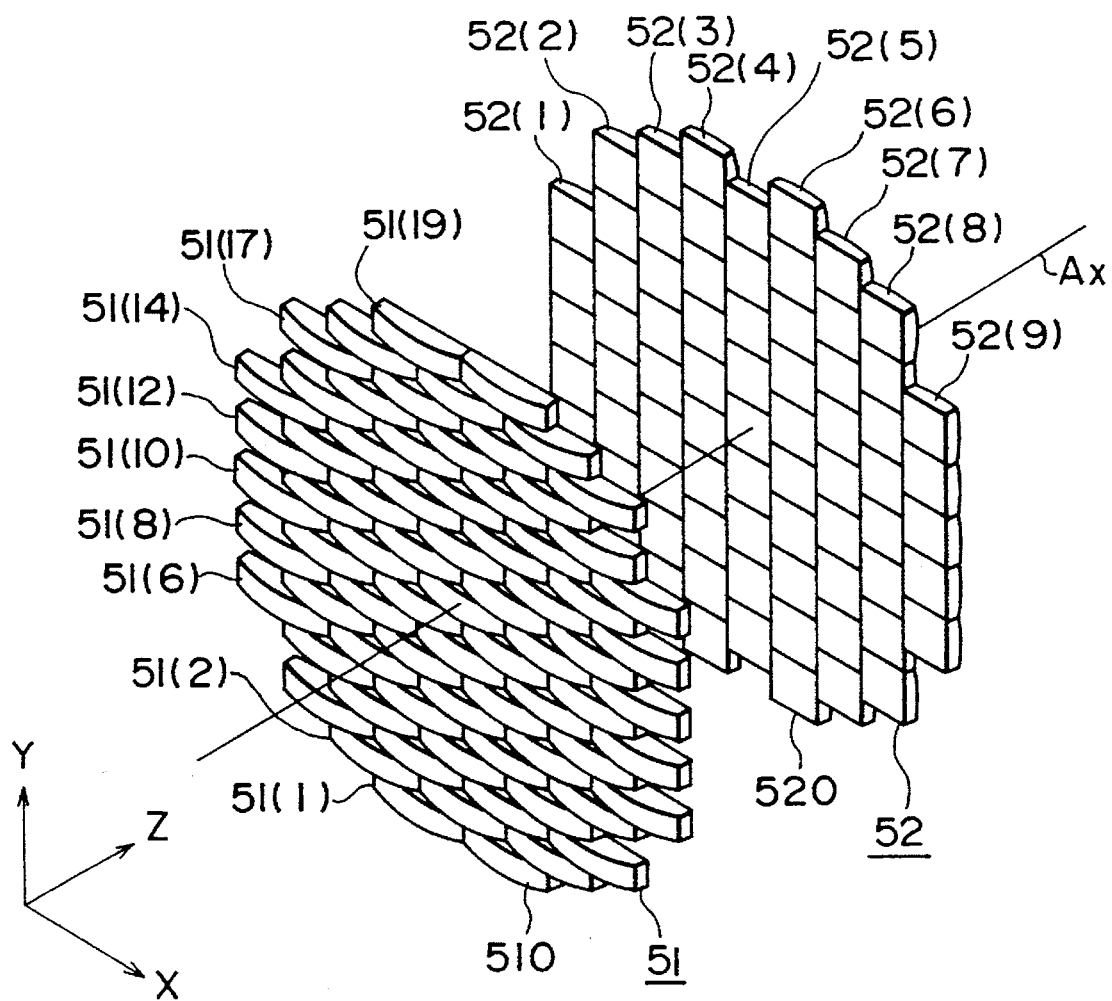
FIG. 9 is a perspective view showing the detail of the structure of the fly-eye lens 50 shown in FIG. 8.

The structure of the fly-eye lens 50 will be described below in more detail with reference to FIG. 9. FIG. 9 is a perspective view of the fly-eye lens 50. As shown in FIG. 9, the first lens group 51 on the light source side has a structure in which 19 arrays of first lens element groups (51(1) to 51(19)) each having a plurality of first lens elements 510 arranged along the X direction are arranged along the Y direction (direction perpendicular to the X direction). The 19 arrays of first lens element groups (51(1) to 51(19)) arranged along the Y direction are alternately shifted from each other by a predetermined amount along the X direction. Therefore, the optical axes of the lens elements 510 of adjacent first lens groups are shifted from each other by a predetermined amount along the X direction.

The second lens group 52 on the exit side has a structure in which nine arrays of second lens element groups (52(1) to 52(9)) each having a plurality of second lens elements 520 arranged along the Y direction are arranged along the X direction (direction perpendicular to the Y direction). The nine arrays of the second lens element groups (52(1) to 52(9)) arranged along the X direction are alternately shifted from each other by a predetermined amount along the Y direction. Therefore, the optical axes of the lens elements 520 of adjacent second lens element groups are shifted from each other by a predetermined amount along the Y direction.

The number of lens elements 510 in the first lens group is the same as that of the lens elements 520 in the second lens group.

With the arrangement of the lens groups as shown in FIG. 9, a parallel beam from the collimator lens 3 passes through the first lens elements 510 in the first lens group 51 and condensed. Thereafter, the beam is focused by the second lens elements 520 in the second lens group 52 arranged to correspond to the first lens elements 510 in a one-to-one correspondence. As a result, as shown in FIG. 8, the light source images Ia (secondary sources) having the same number as that of the second lens elements 520 and a certain size are formed on the exit surfaces of the second lens elements 520 in the second lens group 52, thereby substantially forming a plane light source.

The reason why the light source image Ia having a certain size is formed on the exit side of each second lens element 520 is that the second focal point 22 of the elliptical mirror where the image of the mercury lamp having a certain size is formed and the position where the light source image Ia is formed on the exit side of each second lens element 520 are conjugate with each other with respect to the collimator lens 3 and the fly-eye lens 50. The aperture stop AS having a circular aperture for defining the size of the plurality of secondary sources is arranged at the position of the plurality of secondary sources formed by the fly-eye lens 50.

Referring back to FIG. 8, the beam diverging from the center of the plurality of light source images Ia (light source images whose number corresponds to that of the second lens elements 520 in the second lens group) formed on the exit side of the fly-eye lens 50 by the fly-eye lens 50 is converted into a parallel beam by the condensing function of the condenser lens 6 serving as a condenser optical system, and uniformly illuminates the reticle R having a predetermined circuit pattern in a multiple manner. At this time, the rectangular (slit-like) illumination area IA is formed on the reticle R. The widthwise direction of the illumination area IA corresponds to the direction along the sheet of drawing (Y direction) of FIG. 8 while the longitudinal direction of the illumination area IA corresponds to the direction perpendicular to the sheet of drawing (X direction) of FIG. 8.

The reticle R is illuminated by the illumination area IA to a rectangular (slit-like) shape. The pattern of the reticle R at the illuminated portion is projected and exposed onto a wafer w coated with a resist through a projection optical system PL (projection lens) telecentric on both sides.

The incidence surface of the first lens group 51 of the fly-eye lens 50 is conjugate with the reticle R as a target irradiation surface. The exit surface of the second lens group 52 of the fly-eye lens 50 is conjugate with a pupil EP of the projection optical system PL. Since the plurality of secondary source images are formed on the plane of the pupil EP by the fly-eye lens 50, Köhler illumination of the wafer W is performed.

The projection unit of the scanning-type projection exposure apparatus according to this embodiment will be described below with reference to FIG. 10.

Figure 10:
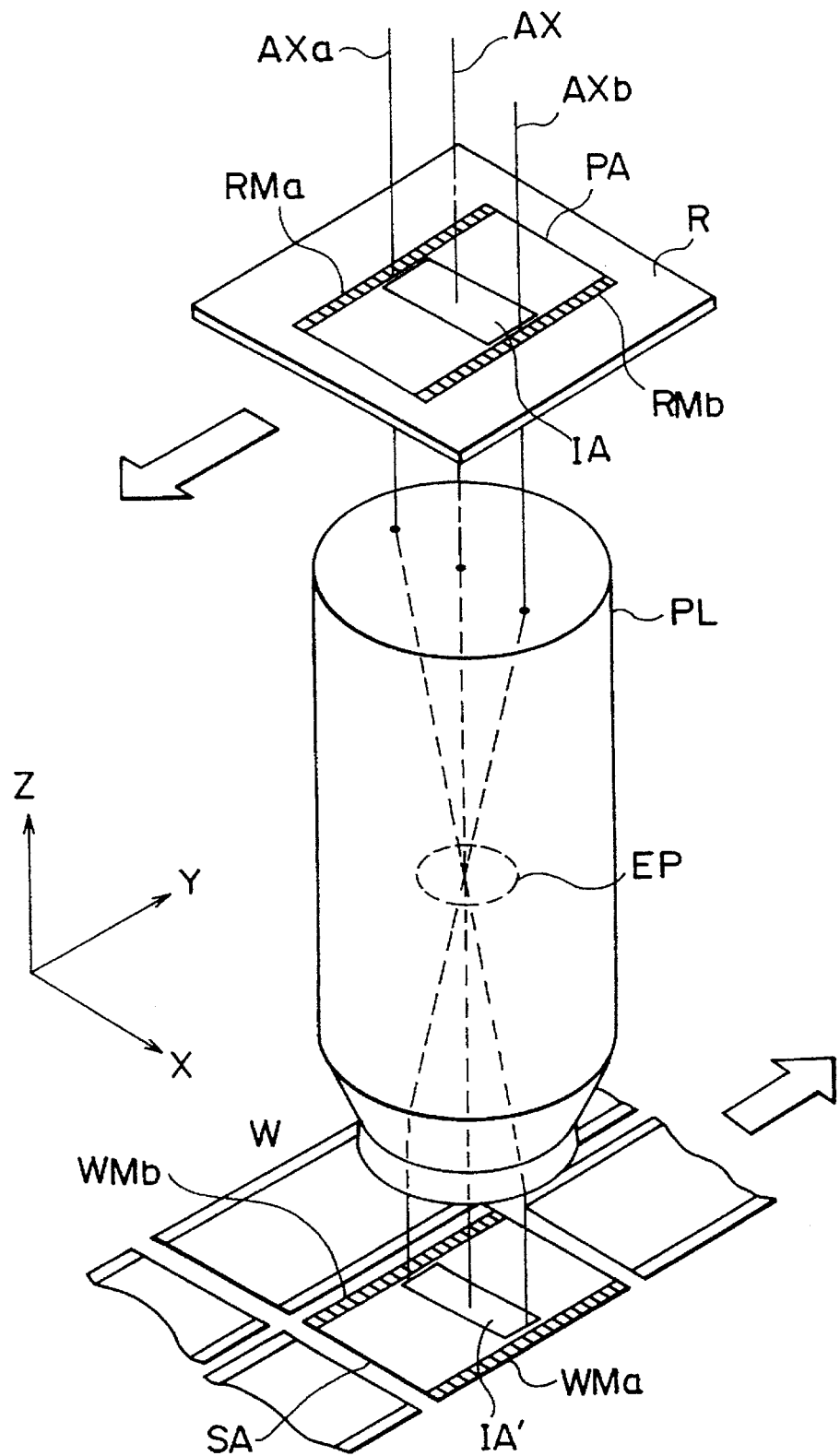
FIG. 10 is a perspective view showing the arrangement of the exposure unit of the apparatus shown in FIG. 8.

FIG. 10 is a perspective view of the projection unit of the projection exposure apparatus.

As shown in FIG. 10, the reticle R is held by a reticle stage (not shown) to be movable in a direction indicated by an arrow. The wafer W is held by a wafer stage (not shown) to be movable in a direction indicated by an arrow reverse to the moving direction of the reticle. The reticle R and the wafer W are held by the stages (not shown) to be conjugate with each other with respect to the projection lens PL serving as a projection optical system.

The rectangular (slit-like) illumination area IA is formed on the reticle R by the illumination unit shown in FIG. 8, as shown in FIG. 10. An illumination area IA' reduced by a predetermined factor (e.g., 1/10 or 1/5) by the projection lens PL is formed on the wafer W. For this reason, the pattern of the reticle R in the illuminated area IA is projected and exposed onto the wafer W coated with a resist through the projection lens PL.

When the reticle R and the wafer W are moved in the opposite directions through the reticle stage and the wafer stage (neither are shown); the circuit pattern of an entire effective exposure area PA of the reticle R is transferred onto a shot area SA on the wafer W.

Strip-like reticle marks RMa and RMb are formed in the peripheral portion of the exposure area PA of the reticle R. Strip-like wafer marks WMa and WMb are formed in the shot area SA of the wafer. The reticle mark RMa and the wafer mark WMa are detected by a first alignment system (not shown) having an optical axis Axa while the reticle mark RMb and the wafer mark WMb are detected by a second alignment system (not shown) having an optical axis Axb, thereby always accurately aligning the reticle R and the wafer W.

Figure 11:
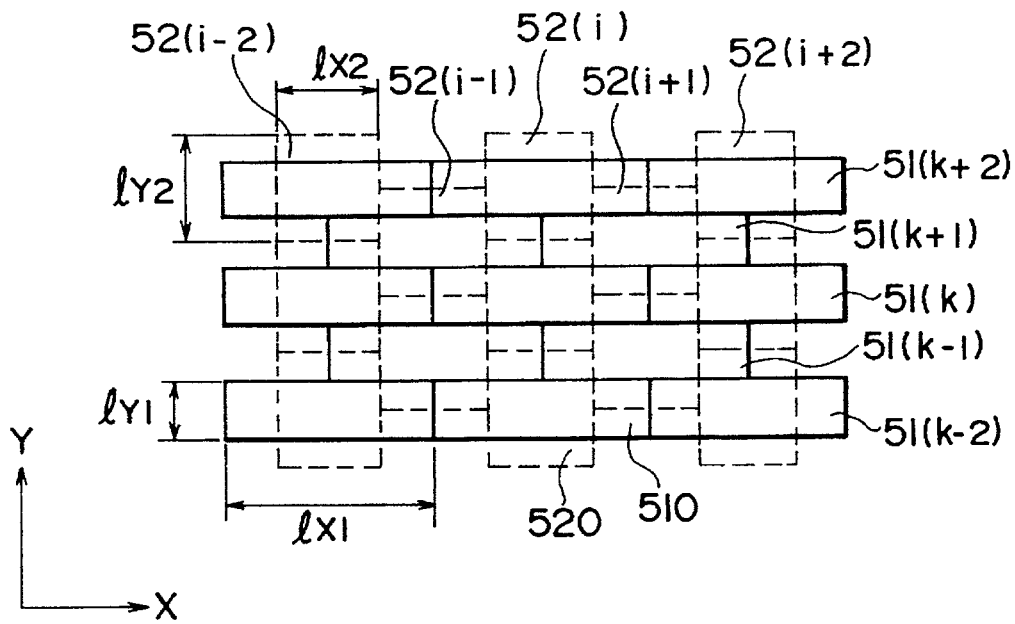
FIG. 11 is a plan view of the fly-eye lens 50 viewed from the light source side when a first lens element in a first lens group on the incidence side of the fly-eye lens 50 has an aspect ratio of 1:4.

The arrangement of the fly-eye lens 50 of this embodiment described above with reference to FIG. 9 will be described below in more detail with reference to FIG. 11. FIG. 11 is a plan view of the fly-eye lens 50 viewed from the light source side when the first lens element 510 in the first lens group 51 on the incidence side has an aspect ratio of 1:4. Referring to FIG. 11, the first lens elements 510 constituting the first lens group 51 on the incidence side are indicated by solid lines while the second lens elements 520 constituting the second lens group 52 on the exit side are indicated by dotted lines.

As shown in FIG. 11, a shifting amount $\Delta l x_1$ along the X direction from the first lens element group 51(k) having a plurality of first lens elements 510 aligned along the X direction to the first lens element group (51(k−1) or 51(k+1)) adjacent to the first lens element group 51(k) and having a plurality of first lens elements 510 aligned along the X direction is $2 l y_2$.

In the second lens element 520 in the second lens group 52, the dimension $l x_2$ of the lens section along the X direction is $2 l y_1$, and the dimension $l y_2$ of the lens section along the Y direction is $2 l y_1$. Therefore, the second lens element 520 has a square lens section. At this time, the shifting amount $\Delta l y_2$ along the Y direction from the second lens element group 52(k) consisting of a plurality of second lens elements 520 aligned along the Y direction to the second lens element group (52(k−1) or 52(k+1)) adjacent to the second lens element group 52(k) is $l y_1$ ($=l y_2/2$).

As is apparent from FIG. 11, in this embodiment, although the lens element 510 in the first lens group 51 on the incidence side of the fly-eye lens 50 has a rectangular shape with an aspect ratio of 1:4, the lens element 520 in the second lens group 52 on the exit side of the fly-eye lens 50 can have a square lens section. For this reason, the lens element 520 in the second lens group 52 on the exit side does not suffer a loss in light amount. Therefore, a plurality of secondary sources having a certain size can be formed by the fly-eye lens 50 at a very high illumination efficiency.

In the above embodiment, the lens element 520 in the second lens group 52 on the exit side has a perfect square lens section. However, the shape of the lens section is not limited to this. Even when the lens element 520 has a rectangular section with an aspect ratio satisfying $1/2 < l x_2 / l y_2 \leq 3/2$, the effect of the present invention can be sufficiently achieved, as a matter of course.

In the above embodiment, one fly-eye lens 50 is arranged in the illumination optical system. However, a plurality of fly-eye lenses 50 may be serially arranged in the illumination optical system. For example, as shown in FIG. 2 of Japanese Patent Laid Open No. 58-147708, a conventional fly-eye lens 4 (first optical integrator) having a square or hexagonal lens section and a relay lens system (5, 10) may be arranged on the optical path between the bandpass filter 4 and the fly-eye lens 50 shown in FIG. 8 of the present invention, thereby using the fly-eye lens 50 shown in FIG. 8 of the present invention as a second optical integrator. Alternatively, an optical integrator (4, 11) shown in FIG. 2 of Japanese Patent Laid Open No. 58-147708 may be replaced with the fly-eye lens 50 shown in FIG. 8 of the present invention. With such arrangement having two optical integrators, a uniform light beam is incident on the second optical integrator through the first optical integrator. Therefore, the target illumination object is illuminated by a more uniform light beam through the second optical integrator. In addition, as shown in FIG. 8 of the present invention, when a light beam having a nonuniform illuminance distribution is incident on one optical integrator 50, the effective numerical aperture of the illumination system, which is defined by the aperture stop AS, may change. However, with an arrangement having two optical integrators, even when a light beam having a nonuniform illuminance distribution is incident on the first optical integrator, a uniform light beam is incident on the second optical integrator by the function of the first optical integrator. Therefore, the problem of a change in effective numerical aperture of the illumination system can be solved.

Figure 12:
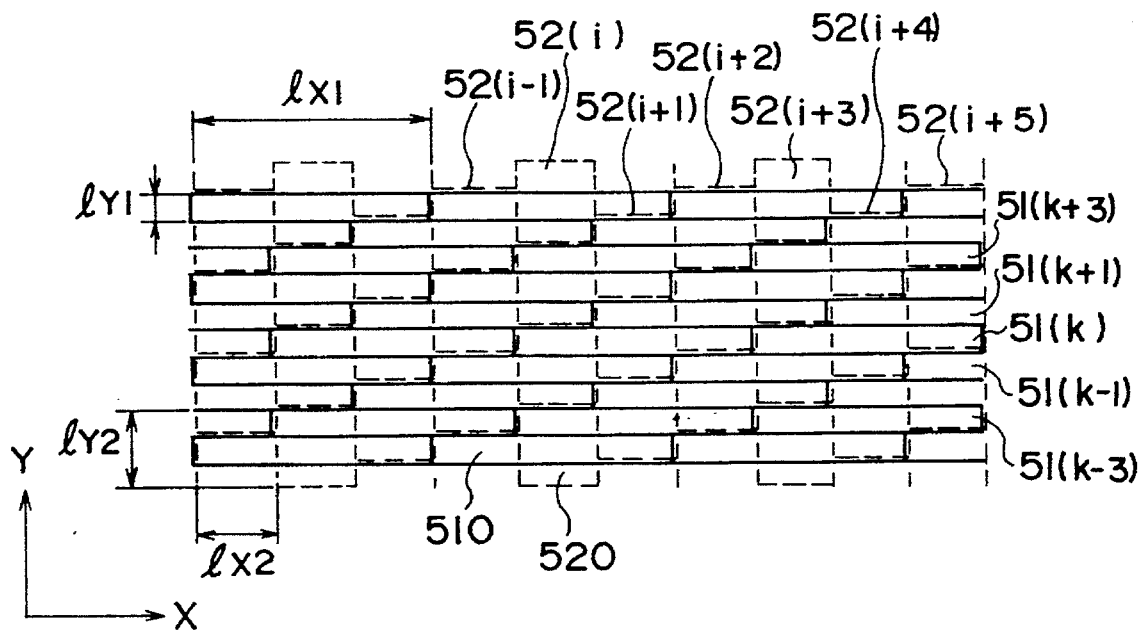
FIG. 12 is a plan view of the fly-eye lens 50 viewed from the light source side when the first lens element in the first lens group on the incidence side of the fly-eye lens 50 has an aspect ratio of 1:9.

Another arrangement of the fly-eye lens 50 described above with reference to FIG. 9 will be described below in detail with reference to FIG. 12. FIG. 12 is a plan view of the fly-eye lens 50 viewed from the light source side when the first lens element 510 in the first lens group 51 on the incidence side has an aspect ratio of 1:9. Referring to FIG. 12, the first lens elements 510 constituting the first lens group 51 on the incidence side are indicated by solid lines while the second lens elements 520 constituting the second lens group 52 on the exit side are indicated by dotted lines.

As shown in FIG. 12, the shifting amount $\Delta lx_1$ along the X direction from the first lens element group $51(k)$ having a plurality of first lens elements 510 aligned along the X direction to the first lens element group ($51(k-1)$ or $51(k+1)$) adjacent to the first lens element group $51(k)$ and having a plurality of first lens elements 510 aligned along the X direction is $3ly_1$.

In the second lens element 520 in the second lens group 52, the dimension $lx_2$ of the lens section along the X direction is $3ly_1$, and the dimension $ly_2$ of the lens section along the Y direction is $3ly_1$. Therefore, the second lens element 520 has a square lens section. At this time, the shifting amount $\Delta ly_2$ along the Y direction from the second lens element group $52(i)$ consisting of a plurality of second lens elements 520 aligned along the Y direction to the second lens element group ($52(i-1)$ or $52(i+1)$) adjacent to the second lens element group $52(i)$ is $3ly_1$ ($=ly_2/3$).

In FIG. 12, as in FIG. 11, although the lens element 510 in the first lens group 51 on the incidence side of the fly-eye lens 50 has a rectangular shape with an aspect ratio of 1:9, the lens element 520 in the second lens group 52 on the exit side of the fly-eye lens 50 can have a square lens section. For this reason, the lens element 520 in the second lens group 52 on the exit side does not suffer a loss in light amount. Therefore, a plurality of secondary sources having a certain size can be formed by the fly-eye lens 50 at a very high illumination efficiency.

As shown in FIG. 9, the fly-eye lens 50 of the above-described embodiment has an arrangement in which the first lens group 51 on the incidence side is separated from the second lens group 52. For this reason, when at least one of the first lens group 51 on the incidence side and the second lens group 52 on the exit side is moved along the optical axis Ax, moved in a plane perpendicular to the optical axis Ax, or rotated about the optical axis Ax, the optical axes of the plurality of lens elements 510 in the first lens group 51 on the incidence side and the optical axes of the plurality of lens elements 520 in the second lens group 52 can be strictly adjusted. In addition, at least one of the first lens group 51 on the incidence side and the second lens group 52 on the exit side is moved along the optical axis Ax, moved in a plane perpendicular to the optical axis Ax, or rotated about the optical axis Ax; the illuminance on the target irradiation surface (the reticle R and the wafer W) or the telecentricity on the target irradiation surface (the reticle R and the wafer W) can be adjusted.

Each lens element in the first and second lens groups constituting the fly-eye lens 50 of the above-described embodiment is not limited to the plano-convex lens. The lens element may be constituted by a lens having a refracting power on at least one surface or can be constituted by a lens having a refracting power on both surfaces.

An arrangement in which the first lens group 51 on the incidence side and the second lens group 52 on the exit side of the fly-eye lens 50 serving as an optical integrator are separated from each other has been described above. However, the arrangement is not limited to this, and the lens element groups may be integrally formed, as shown in FIGS. 13 and 14.

Figure 13:
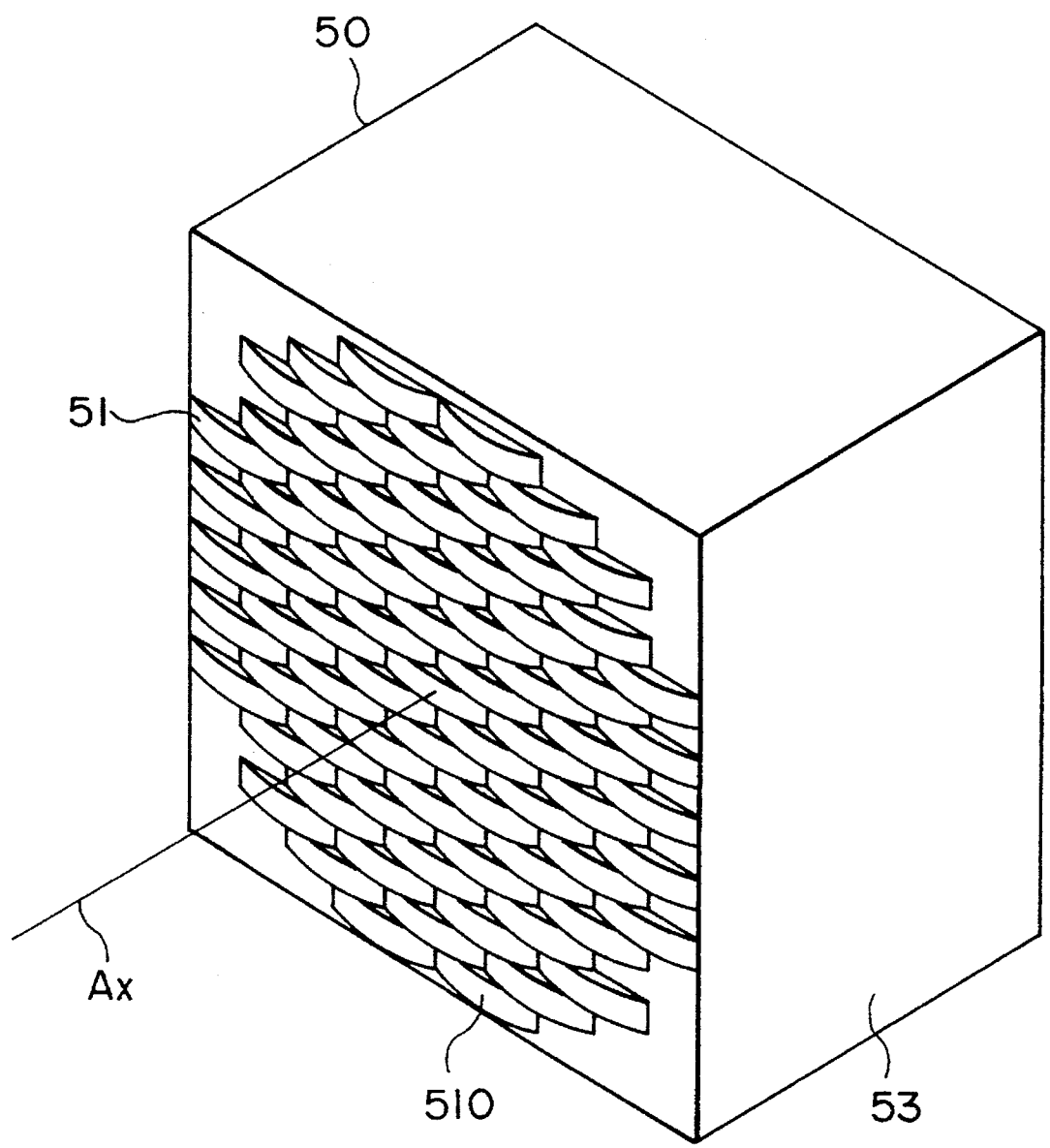
FIG. 13 is a perspective view of the fly-eye lens 50 integrally formed by interposing a glass base 53 between a first lens group 51 on the incidence side and a second lens group 52 on the exit side.
Figure 14:
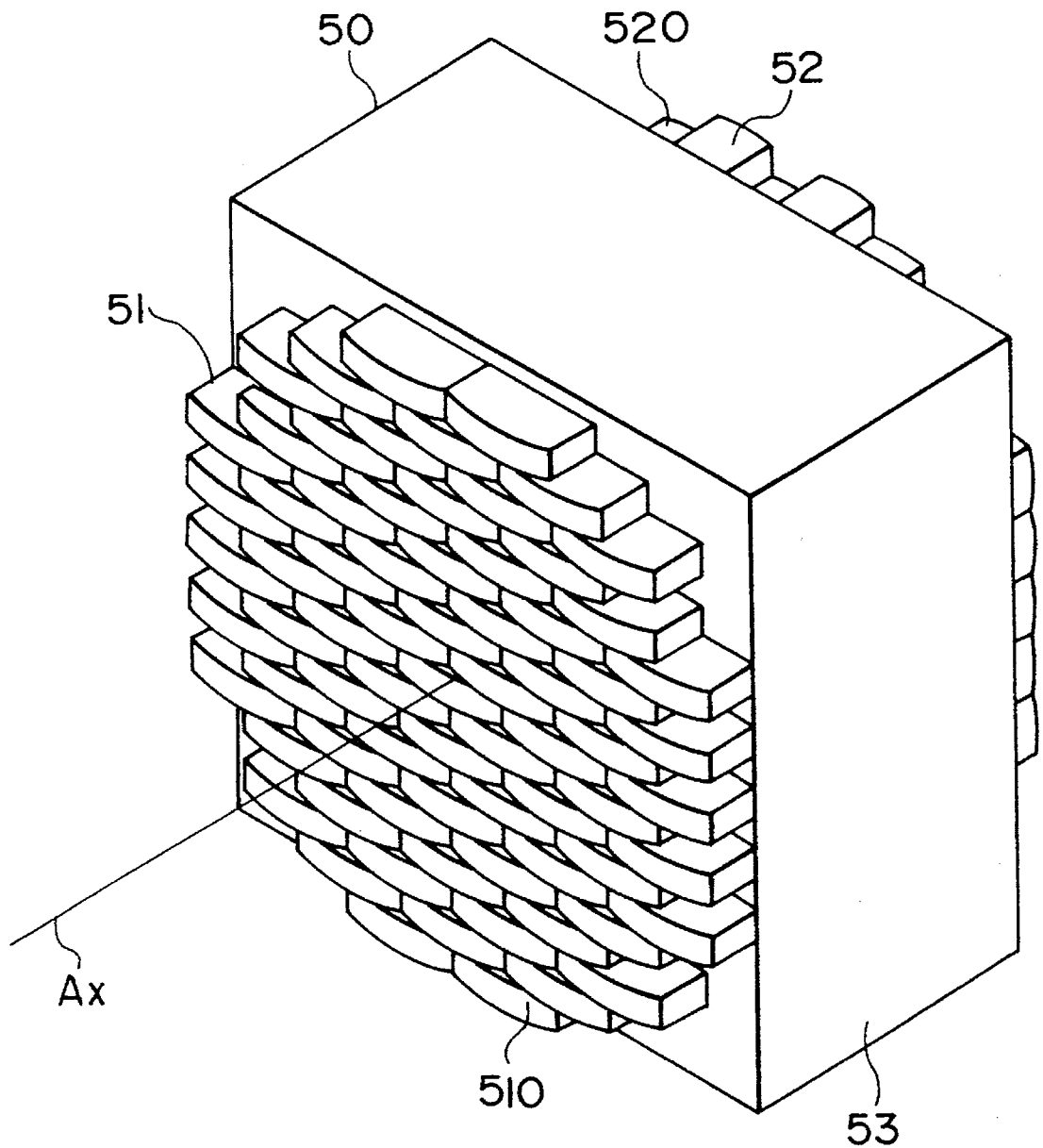
FIG. 14 is a perspective view showing another example of the fly-eye lens 50 shown in FIG. 13.

FIG. 13 is a view of the fly-eye lens 50 integrally formed by interposing a glass base 53 having a predetermined thickness d53 between the first lens group 51 on the incidence side and the second lens group 52 on the exit side shown in FIG. 9. The fly-eye lens 50 is formed to have a predetermined shape by a molding method while the optical axis of each lens element on the light source side on the glass base 53 is caused to strictly coincide with that of the corresponding lens element on the exit side.

The thickness d53 of the glass base 53 along the direction of the optical axis Ax satisfies the following relation:

$$d53 = n53 \times fe \qquad (32)$$

where fe is the focal length (synthesized focal length of the first lens group 51 and the second lens group 52) of the fly-eye lens 50, and n53 is the refractive index of the glass base 53.

FIG. 14 is a view showing an example in which the glass base 53 having the predetermined thickness d53 is interposed between the first lens group 51 on the incidence side and the second lens group 52 on the exit side shown in FIG. 9, and these elements are joined with each other with an adhesive or the like.

In the above embodiment, the rectangular illumination area IA is formed on the target irradiation surface. An embodiment in which a circular arc illumination area IA is formed on a target irradiation surface will be described below with reference to FIGS. 15A and 15B. A scanning-type projection exposure apparatus shown in FIGS. 15A and 15B is proposed in Japanese Patent Application Nos. 4-316717 and 5-279939.

FIG. 15A is a view showing the apparatus of this embodiment viewed from the top. FIG. 15B is a view showing the sectional arrangement of-the apparatus in FIG. 15A viewed from its side.

Figure 16:
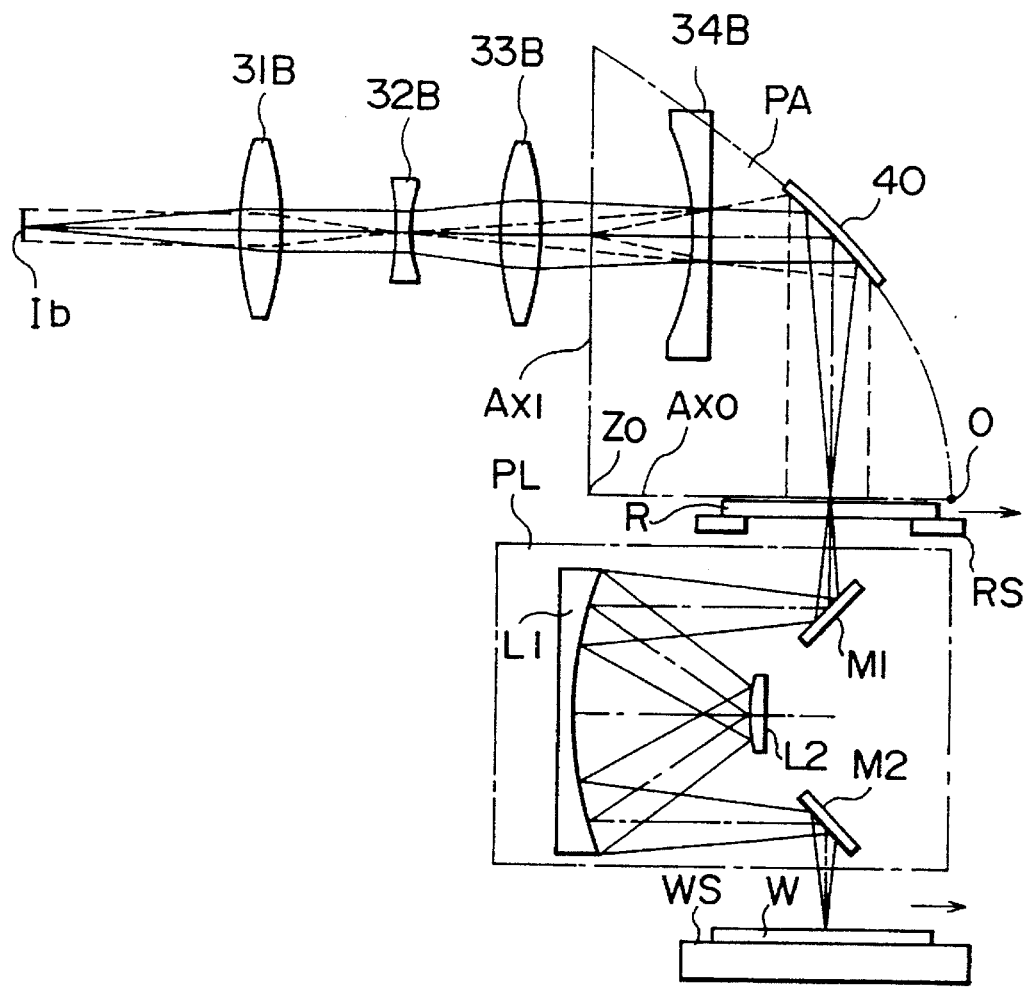
FIG. 16 is a view showing the arrangement of the exposure unit of the apparatus shown in FIG. 15A or 15B.

As shown in FIGS. 15A and 15B, an illumination optical system for uniformly circularly illuminating a reticle R is arranged above the reticle R serving as a target irradiation surface. As shown in FIG. 16, a projection optical system PL for transferring the pattern of the reticle R onto a wafer W is arranged below the reticle R.

A parallel beam for exposure is supplied from a light source unit 10. Although the arrangement is not shown in detail in FIGS. 15A and 15B, the light source unit 10 is constituted by a mercury lamp 1, an elliptical mirror 2 for condensing the light beam from the mercury lamp 1, and a collimator lens 3 serving as a collimator optical system for converting the divergent beam from the elliptical mirror 2 into a parallel beam, as shown in FIG. 8. The parallel beam from the light source unit 10 is incident on a fly-eye lens 50 serving as an optical integrator. The fly-eye lens 50 has the arrangement shown in FIG. 9, and a detailed description thereof will be omitted.

Each lens element 510 constituting a first lens group 51 on the incidence side of the fly-eye lens 50 has a sectional shape satisfying the following relation:

$$lx_1/ly_1 = Lrx/Lry \tag{33}$$

where $lx_1$ is the longitudinal (X direction) dimension of the section of the lens element 510, $ly_1$ is the widthwise (Y direction) dimension of the section of the lens element 510, Lrx is an arc dimension of a circular arc illumination area (a circular arc image field on the reticle R) IA formed by a toric reflecting mirror 40 (to be described later), and Lry is the width of the illumination area IA.

When the ratio of the arc width of the circular arc illumination area IA (to be described later) to the arc length thereof is 1:16 the section of the lens element 510 constituting the first lens group 51 on the incidence side of the fly-eye lens 50 has an aspect ratio of 1:16 and the lens element 520 constituting the second lens group 52 on the exit side of the fly-eye lens 50 has a square section with an aspect ratio of 1:1.

The beam passing through the fly-eye lens 50 forms a plurality of light source images Ia at a position $A_1$ on the exit side of the fly-eye lens 50 by the lens function of the fly-eye lens 50, thereby substantially forming a secondary source serving as a plane light source. An aperture stop AS having a circular aperture portion is arranged at or near the position $A_1$ where the secondary source is formed. With this arrangement, a circular secondary source is formed by the optical integrator 2.

A light beam emanates from each light source image of the circular secondary source which is formed by the aperture stop AS. When the entire secondary source is considered, as shown in FIG. 15A, a parallel beam having an exit angle emanates to be incident on a refocusing optical system 300.

The refocusing optical system 300 has a function of reproducing the plurality of light source images formed by the fly-eye lens 50. The entrance pupil of the refocusing optical system 300 is arranged to coincide with the position $A_1$ of the light source images formed by the fly-eye lens 50.

The refocusing optical system 300 is constituted by a first optical system 30A having a positive refracting power and a second optical system 30B having a positive refracting power. The first optical system 30A is constituted by an fsinθ lens consisting of three lenses such as a biconvex positive lens 31A, a biconcave negative lens 32A, and a biconvex positive lens 33A. The second optical system 30B is constituted by an fθ lens consisting of four lenses such as a biconvex positive lens 31B, a biconcave negative lens 32B, a biconvex positive lens 33B, and a meniscus negative lens 34B having a concave surface facing the light source side.

The first optical system 30A satisfies the relation $y = f_1 \sin\theta_1$ where $f_1$ is the focal length of the first optical system 30A, $\theta_1$ is the incident angle of the incident beam from the secondary source, and y is the image height of an image formed by the first optical system 30A. On the other hand, the second optical system 30B satisfies the relation $y = f_2\theta_2$ where $f_2$ is the focal length of the second optical system 30B, and $\theta_2$ is the exit angle of the exit beam obtained when the light beam from the image height y of the image formed by the first optical system 30A emerges from the second optical system 30B.

With the above arrangement of the refocusing optical system 300, the parallel beam emanating from the secondary source at the position $A_1$ with an exit angle is condensed by the first optical system 30A to form a spatial image Ib having a rectangular shape at a position $B_1$. The light beam from this rectangular spatial image Ib is condensed by the second optical system 30B, converted into a parallel beam, and guided to the toric reflecting mirror 40 serving as a condenser optical system. In other words, the light beam from each point light source forming the secondary source at the position $A_1$ is condensed by the first optical system 30A, as indicated by dotted lines in FIG. 15B, and converted into a parallel beam to illuminate the spatial image Ib at the position $B_1$ in a multiple manner. Thereafter, the parallel beam is incident on the second optical system 30B, temporarily condensed at a position $A_2$ in the negative lens 32B in the second optical system 30B, and guided to the toric reflecting mirror 40 serving as a condenser optical system.

At this time, the real image of the secondary source is formed at the position $A_2$ in the negative lens 23B in the second optical system 30B. The virtual image of the secondary source is formed at a position $A_{20}$ of the exit pupil of the refocusing optical system 300, which virtual image always has a circular shape when the exit side of the refocusing optical system 300 is viewed with an arbitrary angle.

Therefore, a beam diameter P(0) of the parallel beam emerging from the refocusing optical system 300 with an exit angle of 0°($\psi = 0°$) is equal to a beam diameter P($\chi$) of the parallel beam emerging from the refocusing optical system 300 with an exit angle of $\chi$. The parallel beam emerges from the refocusing optical system 300 such that a parallel beam having a predetermined diameter $P_0$ is supplied from the exit pupil of the refocusing optical system 300. The position $B_1$ of the spatial image Ib formed by the first optical system 30A coincides with the focal point on the rear side (target illumination side) of the first optical system 30A and also coincides with the focal point on the front side (light source side) of the second optical system 30B.

The parallel beam emerging from the refocusing optical system 300 with an exit angle is condensed by the toric reflecting mirror 40 to form a circular arc area on the reticle R serving as a target illumination surface.

As shown in FIG. 15B, the toric reflecting mirror 40 is constituted by part of a solid of revolution having a parabolic toric shape, which is rotated about a reference axis $Ax_1$ perpendicular to an axis $Ax_0$ of symmetry (Z-axis) and passing a position $Z_0$ separated from a vertex O of the axis $Ax_0$ of symmetry (Z-axis) by a predetermined distance $(3(4\alpha)^{-1})$ when the vertex O of a parabola PA is defined as an origin, the axis $Ax_0$ of symmetry passing the origin 0 is defined as a Z-axis, a direction passing the origin 0 and parallel to the sheet surface of FIG. 15B perpendicular to the axis $Ax_0$ of symmetry (Z-axis) is defined as a Y-axis, and the parabola PA is represented by $z = \alpha y^2$. When viewed from the upper side, the toric reflecting mirror 40 has a circular arc strip-like shape defined between two latitude circles (40a and 40b) of the solid of revolution having the parabolic toric shape, as shown in FIG. 15A.

At this time, the solid of revolution having the parabolic toric shape is represented as a function substantially satisfying the following relations:

$$\left[z - \frac{3}{4\alpha}\right]^2 + X^2 = \left[\frac{3}{4\alpha} - \alpha y^2\right]^2, 0 \leq y \leq \frac{3^{0.5}}{2\alpha} \tag{34}$$

-continued $$R_{IA} = \frac{3}{4\alpha} \tag{35}$$

where $R_{IA}$ is the distance from an intersection point $Z_0$ between the reference axis $Ax_1$ and the axis $Ax_0$ of symmetry to the vertex (radius of the target illumination area) when a direction perpendicular to the reference axis $Ax_1$ and the axis $Ax_0$ of symmetry and passing the origin (vertex) O is defined as an X-axis.

The toric reflecting mirror 40 is constituted such that the reference axis $Ax_1$ passes through the position $A_{20}$ of the exit pupil of the refocusing optical system 300. More specifically, the position $A_{20}$ of the exit pupil of the refocusing optical system 300 coincides with the focal position of the front side (light source side) of the toric reflecting mirror 40 (the focal length f on the light source side satisfies $f=(2\alpha)^{-1}$).

The parallel beam from the virtual image of the secondary source formed by the refocusing optical system 300 is condensed by the toric reflecting mirror 40 to form a circular arc area at the position $B_2$ on the reticle R arranged at the focal position on the target irradiation surface side of the toric reflecting mirror 40 (the focal length f on the target irradiation surface satisfies $f=(2\alpha)^{-1}$). In other words, the light beams from the virtual images of a plurality of point light sources forming the virtual images of the secondary sources at the position $A_{20}$ are condensed by the toric reflecting mirror 40 to uniformly circularly illuminate the reticle R in a multiple manner. Therefore, the arc illumination area IA is formed on the reticle R while maintaining telecentricity.

As shown in FIG. 16 the projection optical system PL telecentric on both sides with an equal magnification is arranged between the reticle R and the wafer W. The projection optical system PL has a concave mirror L1 and a convex mirror L2 as its basic arrangement and also has reflecting mirrors $M_{51}$ and $M_{52}$, which are respectively arranged between the reticle R and the concave mirror L1 and between the wafer W and the concave mirror L1, to deflect the optical path. The concave mirror L1 has a center of curvature almost coinciding with that of the convex mirror L2. At this time, the radius of curvature of the convex mirror L2 is ½ that of the concave mirror L1.

The position $A_1$ of the light source image formed by the fly-eye lens 50, the position $A_2$ of the light source image formed by the refocusing optical system 300 again, the position $A_{20}$ of the exit pupil of the refocusing optical system 300, and the position of the entrance pupil of the projection optical system PL (the position of the convex mirror 52 or a position near the convex mirror 52) are conjugate with each other. At the same time, the shapes of the light source images and the pupils at these positions are circular.

Therefore, it is found that the circular arc illumination area is formed on the reticle R while maintaining telecentricity, and simultaneously, Köhler illumination is performed.

The position $B_1$ where the parallel beam emerging from the fly-eye lens 50 with an exit angle is formed by the first optical system 30A and the position $B_2$ of the object surface on the reticle R are conjugate with each other.

The reticle R is held by a reticle stage RS while the wafer W is held by a wafer stage WS. The reticle stage RS and the wafer stage WS are moved by a driving system (not shown) in a direction indicated by arrows in an exposure operation, thereby exposing the entire pattern on the reticle R onto the wafer W.

As described above, in this embodiment, the reticle is circularly and uniformly illuminated at a high illumination efficiency and a uniform numerical aperture. For this reason, the circuit pattern on the reticle R can be transferred onto the wafer W in a circular arc pattern in a short exposure time at a high resolving power.

In the embodiment shown in FIG. 16 the projection optical system PL is constituted by an equal magnification system. As a matter of course, the projection optical system PL may be constituted by a reduction system or an enlargement system.

In recent years, an oblique illumination technique is proposed in which the shape of the secondary source formed by the fly-eye lens 50 serving as an optical integrator is changed to obliquely illuminate the reticle R, thereby largely improving the resolving power and the focal depth inherent to the projection optical system. This technique has received a great deal of attention.

For example, in a zone illumination method, a zone (doughnut-like) aperture portion is formed in the aperture stop AS which is arranged on the exit side of the optical integrator to form a zone secondary source and obliquely illuminate the reticle R, thereby improving the resolving power and the focal depth of the projection optical system. In a special oblique illumination method, two or four eccentric aperture portions are formed in the aperture stop AS to form two or four eccentric secondary sources and obliquely illuminate the reticle R, thereby obtaining resolving power and focal depth larger than those in the zone illumination method. This technique is disclosed in, e.g., Japanese Patent Laid-Open No. 4-101148.

Figure 17A:
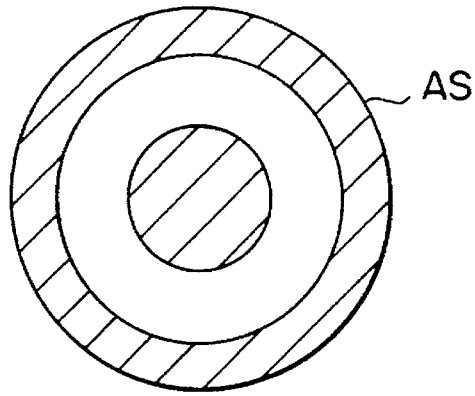
FIGS. 17A and 17B are plan views respectively showing an aperture stop having an annular aperture portion and an aperture stop having four eccentric aperture portions.

As another application of the apparatus of the embodiment shown in FIG. 8 or FIGS. 15A and 15B, the aperture stop AS having a zone aperture portion as shown in FIG. 17A is arranged in place of the aperture stop AS having a circular aperture and arranged on the exit side of the fly-eye lens 50. In this case, the light beam from the zone light source formed by the aperture stop AS can obliquely, circularly, and uniformly illuminate the reticle R at a uniform numerical aperture. For this reason, a finer reticle pattern can be accurately transferred onto the wafer W at a larger focal depth.

Figure 17B:
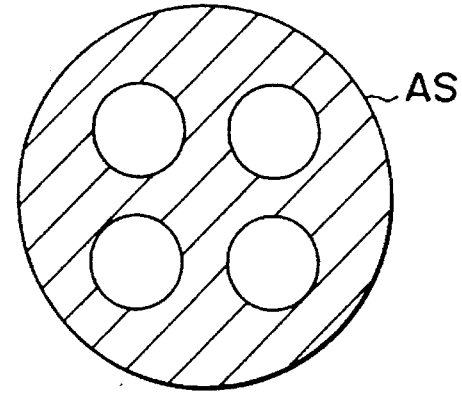

Referring to FIGS. 8, 15A, and 15B, the aperture stop AS having four eccentric aperture portions as shown in FIG. 17B is arranged in place of the aperture stop AS having a circular aperture and arranged on the exit side of the fly-eye lens 50. In this case, the light beam from the four eccentric light sources formed by the aperture stop AS can obliquely, circularly, and uniformly illuminate the reticle R at a uniform numerical aperture. This technique is very effectively used because a finer reticle pattern can be accurately transferred onto the wafer W at a larger focal depth. When the aperture stop shown in FIG. 17A or 17B is to be used, the projection optical system shown in FIG. 8 or FIGS. 15A and 15B is preferably constituted by a reduction system.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 6-094612 (094612/1994) filed on May 9, 1994 and No. 6-226395 (226395/1994) filed on Sep. 21, 1994 are hereby incorporated by reference.

What is claimed is:

1. An optical integrator comprising:

a first lens group having first and second front lens element groups of first lens elements having a rectangular lens section and arranged along a first direction, said first and second front lens element groups being arranged along a second direction perpendicular to the first direction, said first front lens element group being adjacent to said second front lens element group, positions of said first lens elements belonging to said first front lens element group shifting by a predetermined length from positions of said first lens elements belonging to said second front lens element group along the first direction;

a second lens group having first and second rear lens element groups of second lens elements having a rectangular lens section different from the lens section of said first lens element and arranged along the second direction, said first and second rear lens element groups being arranged along the first direction, said first rear lens element group being adjacent to said second rear lens element group, positions of said second lens elements belonging to said first rear lens element group shifting by a predetermined length from positions of said second lens elements belonging to said second rear lens element group along the second direction; and a base arranged between said first and second lens groups for fixing said first and second lens groups relatively at a state in which a center of the lens section of said first lens element coincides with a center of the lens section of said second lens element.

2. An integrator according to claim 1, wherein said first lens element is integrally formed with said base.

3. An integrator according to claim 2, wherein said first lens element is integrally formed with said base by a molding method.

4. An integrator according to claim 2, wherein said first lens element and said base are fixed to each other with an adhesive.

5. An optical integrator comprising:

a first lens group having first and second front lens element groups of first lens elements having a rectangular lens section and arranged along a first direction, said first and second front lens element groups being arranged along a second direction perpendicular to the first direction, said first front lens element group being adjacent to said second front lens element group, positions of said first lens elements belonging to said first front lens element group shifting by a predetermined length from positions of said first lens elements belonging to Said second front lens element group along the first direction; and a second lens group having first and second rear lens element groups of second lens elements having a rectangular lens section different from the lens section of said first lens element and arranged along the second direction, said first and second rear lens element groups being arranged along the first direction, said first rear lens element group being adjacent to said second rear lens element group, positions of said second lens elements belonging to said first rear lens element group shifting by a predetermined length from positions of said second lens elements belonging to said second rear lens element group along the second direction, wherein a center of the lens section of said first lens element coincides with a center of the lens section of said second lens element, and the following relations are satisfied:

$1x_1/1y_1=a, a>2$
$\Delta 1x_1=a \cdot 1y_1/m, m \geq 2$
$1x_2/1y_2=a/m^2$
$(4a+1)^{0.5}/2-0.5 \leq m \leq (4a+1)^{0.5}/2+0.5$ where $1x_1$ is a dimension of the lens section of said first lens element along the first direction, $1y_1$ is a dimension of the lens section of said first lens element aloin the second direction, $1x_2$ is a dimension of the lens section of said second lens element along the first direction, $1y_2$ is a dimension of the lens section of said second lens element along the section direction, m is a natural number, and $\Delta 1x_1$ is a shifting amount along the first direction from the first lens element belonging to said first front lens element group to the first lens element belonging to said second front lens element group.

6. An integrator according to claim 5, wherein a relation $1/2 < 1x_2/1y_2 \leq 3/2$ is satisfied.

7. An integrator according to claim 5, wherein a relation $2/3 \leq 1x_2/1y_2 \; 3/2$ is satisfied.

8. An integrator according to claim 5, wherein said first lens groups and said second lens groups are separated from each other.

9. A projection exposure apparatus comprising:

a light source system for supplying a beam;

an optical integrator for forming a plurality of light source images based on the beam from said light source system;

a condenser optical system for condensing beams from said optical integrator respectively and illuminating a rectangular or circular arc area on an object to be illuminated in a multiple manner;

a first stage for supporting the object to be illuminated;

a second stage for supporting an object to be exposed; and a projection optical system for making a position on the object to be illuminated supported by said first stage conjugate with a position on the object to be exposed supported by said second stage, wherein said optical integrator comprises:

a first lens group having first and second front lens element groups of first lens elements having a rectangular lens section and arranged along a first direction, said first and second front lens element groups being arranged along a second direction perpendicular to the first direction, said first front lens element group being adjacent to said second front lens element group, positions of said first lens elements belonging to said first front lens element group shifting by a predetermined length from positions of said first lens elements belonging to said second front lens element group along the first direction; and a second lens group having first and second rear lens element groups of second lens elements having a rectangular lens section different from the lens section of said first lens element and arranged along the second direction, said first and second rear lens element groups being arranged along the first direction, said first rear lens element group being adjacent to said second rear lens element group, positions of said second lens elements belonging to said first rear lens element group shifting by a predetermined length from positions of said second lens elements belonging to said second rear lens element group along the second direction, a center of the lens section of said first lens element coincides with a center of the lens section of said second lens element, and the following relations are satisfied:

$1x_1/1y_1=a, a>2$ $\Delta 1x_1 = a \cdot 1y_1/m, \ m \geq 2$ $1x_2/1y_2 = a/m^2$ $(4a+1)^{0.5}/2 - 0.5 \leq m \leq (4a+1)^{0.5}/2 + 0.5$ where $1x_1$ is a dimension of the lens section of said first lens element along the first direction, $1y_1$ is a dimension of the lens section of said first lens element aloin the second direction, $1x_2$ is a dimension of the lens section of said second lens element along the first direction, $1y_2$ is a dimension of the lens section of said second lens element along the section direction, m is a natural number, and $\Delta 1x_1$ is a shifting amount along the first direction from the first lens element belonging to said first front lens element group to the first lens element belonging to said second front lens element group.

10. An apparatus according to claim 9, further comprising an aperture stop arranged between said optical integrator and said condenser optical system.

11. An apparatus according to claim 10, wherein said aperture stop has a zone aperture portion.

12. An apparatus according to claim 10, wherein said aperture stop has a plurality of eccentric aperture portions.

13. An apparatus according to claim 9, wherein said projection optical system is a reduction system.

14. An integrator according to claim 1, wherein said base being made of a material having the same refractive index as said first lens element.

15. A projection exposure apparatus according to claim 9, further comprising a base arranged between said first and second lens groups for fixing said first and second lens groups relatively at a state in which a center of the lens section of said first lens element coincides with a center of the lens section of said second lens element, said base being made of a material having the same refractive index as said first lens element.

* * * * *